US012632035B2

(12) United States Patent
Gao et al.

(10) Patent No.: US 12,632,035 B2
(45) Date of Patent: May 19, 2026

(54) GENERIC PID DESIGN AND TUNING

(71) Applicant: CLEVELAND STATE UNIVERSITY, Cleveland, OH (US)

(72) Inventors: Zhiqiang Gao, Cleveland, OH (US); Yu Hu, Cleveland, OH (US)

(73) Assignee: CLEVELAND STATE UNIVERSITY, Cleveland, OH (US)

( * ) Notice: Subject to any disclaimer, the term of this patent is extended or adjusted under 35 U.S.C. 154(b) by 408 days.

(21) Appl. No.: 18/383,160

(22) Filed: Oct. 24, 2023

(65) Prior Publication Data

US 2025/0130551 A1 Apr. 24, 2025

(51) Int. Cl.
 *G05B 19/4155* (2006.01)
 *H03H 17/02* (2006.01)

(52) U.S. Cl.
 CPC ............... *G05B 19/4155* (2013.01); *G05B 2219/42033* (2013.01); *H03H 17/02* (2013.01)

(58) Field of Classification Search
 CPC ...................... G05B 19/4155; H03H 17/02
 See application file for complete search history.

(56) References Cited

U.S. PATENT DOCUMENTS

| | | |
|---|---|---|
| 8,041,436 B2 | 10/2011 | Gao |
| 8,060,340 B2 | 11/2011 | Gao et al. |
| 8,180,464 B2 | 5/2012 | Gao et al. |
| 8,571,691 B2 | 10/2013 | Gao |
| 8,644,963 B2 | 2/2014 | Gao et al. |
| 8,710,777 B2 | 4/2014 | Tian |
| 9,041,337 B2 | 5/2015 | Tian |
| 9,082,079 B1 | 7/2015 | Coenen |
| 9,369,073 B1 | 6/2016 | Tian |
| 9,690,261 B2 | 6/2017 | Tian et al. |
| 2016/0072472 A1 | 3/2016 | Fedder et al. |
| 2017/0017058 A1* | 1/2017 | Sumioka ................. G03B 3/10 |
| 2017/0074753 A1 | 3/2017 | Tian |
| 2017/0227943 A1* | 8/2017 | Salyers, III ........ G05B 19/0426 |
| 2017/0250628 A1 | 8/2017 | Tian |
| 2017/0282932 A1 | 10/2017 | Tian |
| 2020/0341442 A1* | 10/2020 | Meisner .............. G05B 19/048 |
| 2022/0077688 A1 | 3/2022 | Patarroyo et al. |

FOREIGN PATENT DOCUMENTS

WO 2009/032680 3/2009

OTHER PUBLICATIONS

International Search Report and Written Opinion for International Application No. PCT/US2024/051681 dated Dec. 26, 2024.

* cited by examiner

*Primary Examiner* — Mark A Connolly

(74) *Attorney, Agent, or Firm* — Amin, Turocy & Watson, LLP

(57) ABSTRACT

An industrial controller implements a closed-loop control technique referred to as generic PID control, or GPID, which makes explicit the basic principles and methods of quantitatively combining the past, present and future in controller design and tuning. Generic PID control is backward compatible in design and in tuning with current industrial control software interfaces, and as such can be easily adopted onto existing control systems. Generic PID is also widely applicable to artificial intelligence (AI) and data analytics, such as machine learning, where error-correction is core to all algorithms.

20 Claims, 40 Drawing Sheets

Proportional control with low pass filter $$K(s) = \frac{(1.005)\omega_c}{\left(1 + \frac{0.1}{\omega_c}s\right)}$$

$$P(s) = \frac{s}{\left(\frac{0.1}{\omega_c}s + 1\right)^2}$$

1st order differentiator with low pass filter $$Q(s) = \frac{1}{\left(\frac{0.1}{\omega_c}s + 1\right)^2}$$

2nd order low pass filter

GPID for 1st Order Plant

906

$$\omega_c \text{ at } \frac{(90 - \varnothing_{pm})\pi}{180 T_l} \ r/s$$

Total Disturbance Estimation

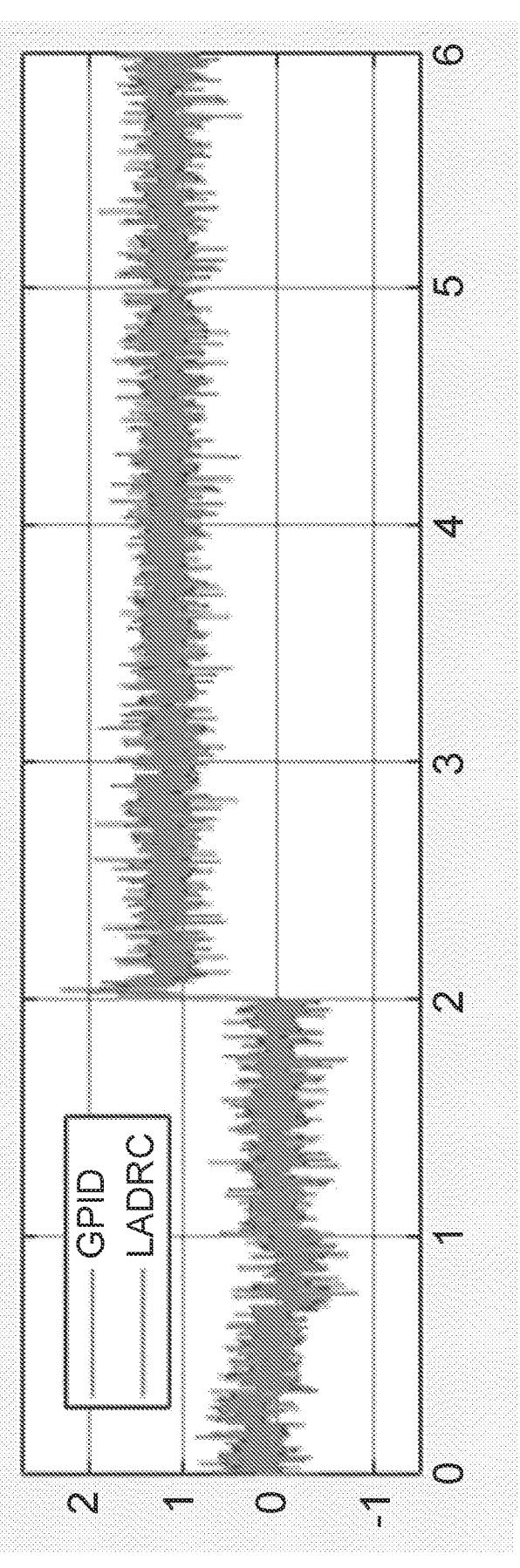
Control
FIG. 20d

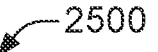

RECEIVE, AS A TUNING PARAMETER, A VALUE OF A CONTROL SYSTEM BANDWIDTH $\omega_c$ ⟋2502

SET VALUES OF TUNING PARAMETERS OF A CASCADE LEAD COMPENSATOR WITH A FIRST LOWPASS FILTER, AN $N^{TH}$ ORDER DIFFERENTIATOR WITH A SECOND LOWPASS FILTER, AND A THIRD LOWPASS FILTER BASED ON THE VALUE OF $\omega_c$ ⟋2504

SET A VALUE OF A CONTROL SIGNAL $u$ THAT CONTROLS A SYSTEM VARIABLE OF A PLANT BASED ON A SUM OF THE OUTPUTS OF THE CASCADE LEAD COMPENSATOR WITH THE FIRST LOWPASS FILTER, THE $N^{TH}$ ORDER DIFFERENTIATOR WITH THE SECOND LOWPASS FILTER, AND THE THIRD LOWPASS FILTER, WHERE

THE INPUT OF THE CASCADE LEAD COMPENSATOR IS AN ERROR SIGNAL $e$ BETWEEN THE ACTUAL VALUE $y$ OF THE SYSTEM VARIABLE AND A TARGET VALUE $r$ OF THE SYSTEM VARIABLE, AND

THE INPUT OF THE THIRD LOWPASS FILTER IS THE CONTROL SIGNAL $u$

GENERIC PID DESIGN AND TUNING

TECHNICAL FIELD

This disclosure generally relates to control systems, and, more specifically, to proportional-integral-derivative (PID) control of systems and processes.

BACKGROUND

Many industrial automation applications employ closed-loop control systems to control mechanical motion systems or industrial processes. Motion control systems typically include one or more motors or other motion devices operating under the guidance of a controller, which sends position or speed control instructions to the motor in accordance with a user-defined control algorithm. Some motion control systems operate in a closed-loop configuration, whereby the controller instructs the motor to move its corresponding load to a target position or to transition to a target velocity (a desired state) and receives feedback information indicating an actual state of the motor or its load. The controller monitors the feedback information to determine whether the motor has reached the target position or velocity, and adjusts the control signal to correct errors between the actual state and the desired state.

Similar control techniques are also used in process control applications. In the case of process control applications, the control signal generated by the controller regulates one or more process variables in accordance with a control algorithm, and a measured value of the process variable is provided to the controller as feedback data, allowing the controller to adjust the control signal as needed based on the actual value of the process variable relative to a desired setpoint.

Many industrial controllers perform closed-loop control using proportional-integral-derivative (PID) control. This control approach requires the designer of the control system to determine and set suitable values of the controller parameters; namely, the controller's proportional, integral, and derivative gains. The process of selecting suitable gain coefficients for the controller is known as tuning. Designers typically seek to select values of these controller parameters to achieve an optimal trade-off between performance and system stability. For example, an aggressively tuned controller may result in a system that tracks a desired position or setpoint with high accuracy and a fast response time, but may be rendered unstable in the presence of system noise and uncertainties. Alternatively, tuning the controller more conservatively will improve system stability, but at the expense of performance.

There is no formal methodology for determining optimal values of the PID controller parameters, and consequently the designer must resort to a trial-and-error process to obtain a set of PID gain constants that yield an approximation of the desired control response. Moreover, a given PID controller tuning is generally specific to its control application or plant, and is not scalable or portable to other control applications, even if those applications are designed to perform broadly similar control functions.

The above-described is merely intended to provide an overview of some of the challenges facing conventional industrial control systems. Other challenges with conventional systems and contrasting benefits of the various non-limiting embodiments described herein may become further apparent upon review of the following description.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its purpose is to present some concepts of one or more embodiments in a simplified form as a prelude to the more detailed description that is presented later.

One or more embodiments of the present disclosure relate to industrial control systems that implement a closed-loop control approach described herein as generic PID control, or GPID. GPID control is a 3 degree-of-freedom (3DoF) generalization of PID control that makes explicit the basic principles and methods of quantitatively combining the past, present and future in controller design and tuning. GPID control is backward compatible in design and in tuning with current industrial control software interfaces, and as such can be easily adopted onto existing control systems. GPID is also widely applicable to artificial intelligence (AI) and data analytics, such as machine learning, where error-correction is core to all algorithms.

The following description and the annexed drawings set forth herein detail certain illustrative aspects of the one or more embodiments. These aspects are indicative, however, of but a few of the various ways in which the principles of various embodiments can be employed, and the described embodiments are intended to include all such aspects and their equivalents.

BRIEF DESCRIPTION OF THE DRAWINGS

FIG. 20d plots the control signal with K(s) of 35° phase margin.

FIG. 25 is a flowchart of an example methodology for tuning an GPID controller for control of a plant.

DETAILED DESCRIPTION

Figure 1:
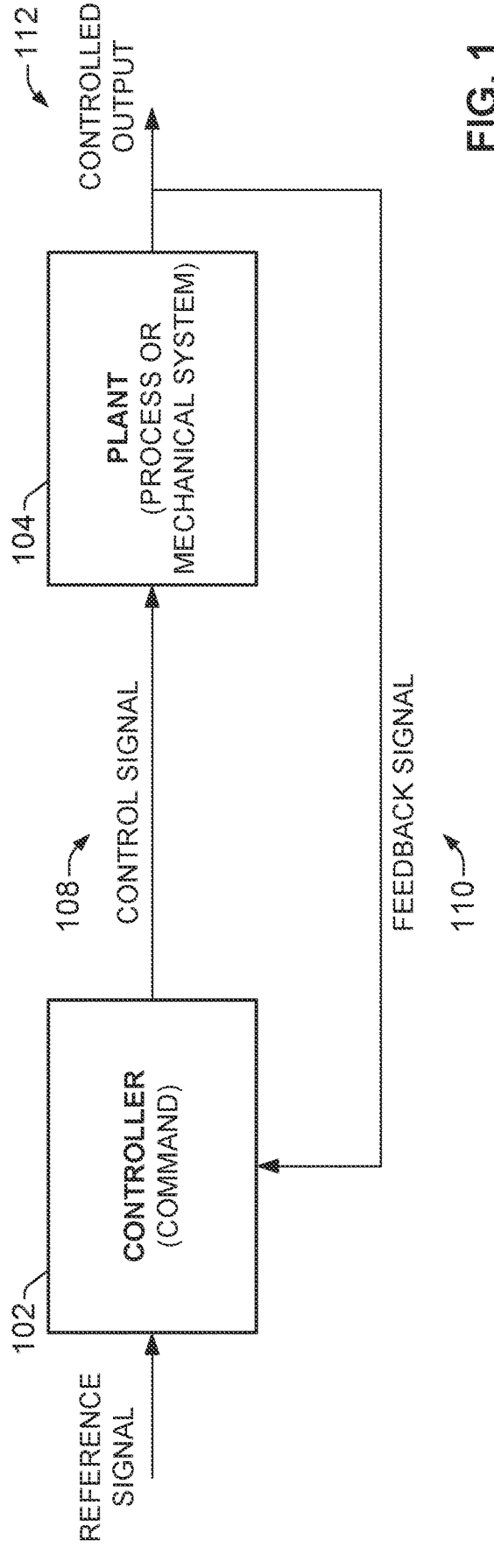
FIG. 1 is a simplified diagram of a closed-loop control architecture.

Various embodiments are now described with reference to the drawings, wherein like reference numerals refer to like elements throughout. In the following description, for the purposes of explanation, numerous specific details are set forth in order to provide an understanding of this disclosure. It is to be understood, however, that such embodiments may be practiced without these specific details, or with other methods, components, materials, etc. In other instances, structures and devices are shown in block diagram form to facilitate describing one or more embodiments.

Systems and methods described herein relate to control systems and methos that implement a generalization of PID control referred to as generic PID (or GPID), which makes explicit the basic principles and methods of how past, present, and future error are quantitatively combined in a controller design and tuning.

FIG. 1 is a simplified diagram of a closed-loop control architecture. Controller 102 is programmed to control plant 104, which can be a mechanical system (e.g., a motor that drives a mechanical load) or an industrial process in which one or more process variables are regulated by the controller 102 in accordance with a control algorithm. In an example mechanical application, plant 104 may comprise a motor-driven industrial automation application or industrial tool, including but not limited to a machining or material handling robot, a conveyor, a tooling machine, a motorized hand tool, etc. Plant 104 may also comprise a motor-driven traction or propulsion system of an electric vehicle design, including but not limited to an electric or hybrid electric automobile, a bicycle, a forklift or other industrial vehicle, a scooter, a railway vehicle such as a train, or other such vehicles. Plant 104 may also be a series of fans or pumps that are part of an HVAC (heating, ventilating, and air conditioning) system, where the speed of the motors or pumps is controlled by controller 102. Plant 104 may also be a motor-driven home or industrial appliance. For example, controller 102 may be used to control a motor that drives the drum of a home or industrial washing machine, to control the spinning of a centrifuge, or to control the motion of other such appliances. These example control systems are not intended to be exhaustive; rather, plant 104 can comprise substantially any type of mechanical motion system or industrial process.

Controller 102 and plant 104 make up the primary components of an example closed-loop control system. In an example mechanical application, plant 104 can represent a motor-driven axis of a single- or multi-axis robot or positioning system. In such applications, controller 102 sends control signal (or actuating signal) 108 instructing the motor to move the mechanical load to a desired position at a desired speed, or along a desired trajectory (where the desired position or speed is set by the controller's program or based on a reference signal provided to the controller 102). The control signal 108 can be provided directly to the motor, or to a motor drive (not shown) that controls the power delivered to the motor (and consequently the speed and direction of the motor). Feedback signal 110 indicates a current state (e.g., position, velocity, etc.) of the motor and/or mechanical load in substantially real-time. In servo-driven systems, feedback signal 110 can be generated, for example, by an encoder or resolver (not shown) that tracks an absolute or relative position of the motor. In sensorless systems lacking a velocity sensor, the feedback signal can be provided by a speed/position estimator. In this example, the controlled output 112 of the plant 104—which the feedback signal 110 measures—represents the position of the load (in speed control applications, the controlled output 112 will be the velocity). During a move operation, the controller monitors feedback signal 110 to ensure that the load has accurately reached the target position or speed. The controller 102 compares the actual position or speed of the load as indicated by the feedback signal 110 with the target position or speed, and adjusts the control signal 108 as needed to reduce or eliminate error between the actual and target positions or speeds.

In another example application, plant 104 can represent a spinning load (e.g., a pump, a washing machine, a centrifuge, etc.) driven by a motor, in which controller 102 controls the rotational velocity of the load. In this example, controller 102 provides an instruction to the motor (via control signal 108) to transition from a first velocity to a second velocity, and makes necessary adjustments to the control signal 108 based on feedback signal 110 (in this example, the controlled output 112 of plant 104 is the velocity).

It is to be appreciated that the system parameter identification techniques of the present disclosure are not limited to use with the example types of control systems described above, but rather are applicable to substantially any type of motion control or industrial process application.

As noted above, many controllers 102 control their plants 104 using a PID control loop. PID control, as a mathematical equation and an algorithm, has been a dominant control technology for many years, and has remained essentially unchanged. The design principle behind PID control has never been made explicitly intelligible. Instead, there is only a vague understanding that the control signal is based on past, present and future information on tracking error. It has not been systematically established how this information is defined, obtained, and brought together in a proper combination. Together with parameter tuning, PID design is still very much an art, requiring a trial-and-error approach by experienced control engineers. As a result, a majority of industrial control loops are not tuned properly, resulting in unnecessary energy waste and performance degradation. Moreover, PID control as a dominant technology is not easily scalable to higher order, more complex dynamic processes, severely limiting its effectiveness as a general-purpose solution of industrial control.

To address these and other issues, one or more embodiments described herein provide an industrial controller designed to implement a closed-loop control approach described herein as generic PID control, or GPID. GPID control is a 3 degree-of-freedom (3DoF) generalization of PID control that makes explicit the basic principles and methods of quantitatively combining the past, present and future in controller design and tuning. GPID control is backward compatible in design and in tuning with current industrial control software interfaces, and as such can be easily adopted onto existing control systems. GPID is also widely applicable to artificial intelligence (AI) and data analytics, such as machine learning, where error-correction is core to all algorithms.

Figure 2:
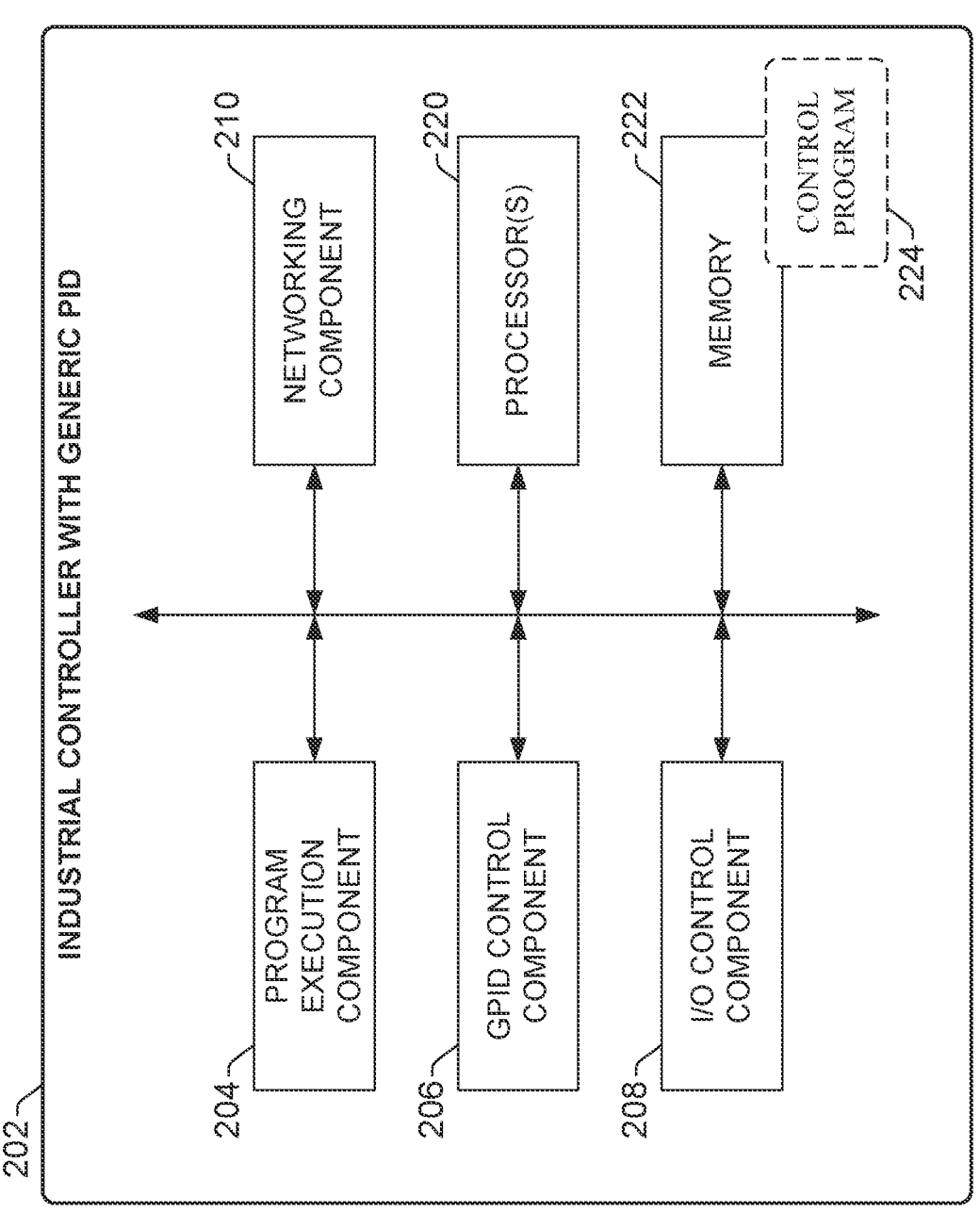
FIG. 2 is a block diagram of an example industrial controller that supports generic PID (GPID) control.

FIG. 2 is a block diagram of an example industrial controller 202 that supports GPID control. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines—e.g., computers, computing devices, automation devices, virtual machines, etc.—can cause the machines to perform the operations described. Industrial controller 202 can be substantially any type of industrial control device, including but not limited to a programmable logic controller (PLC), a safety relay or safety controller, a motor drive, a system-on-chip (SoC), a soft controller, or another type of control device or system.

Industrial controller 202 can include a program execution component 204, a GPID control component 206, an I/O control component 208, a networking component 210, one or more processors 220, and memory 222. In various embodiments, one or more of the program execution component 204, GPID control component 206, I/O control component 208, networking component 210, the one or more processors 220, and memory 222 can be electrically and/or communicatively coupled to one another to perform one or more of the functions of the industrial controller 202. In some embodiments, components 204, 206, 208, and 210 can comprise software instructions stored on memory 222 and executed by processor(s) 220. Industrial controller 202 may also interact with other hardware and/or software components not depicted in FIG. 2. For example, processor(s) 220 may interact with one or more external user interface devices, such as a keyboard, a mouse, a display monitor, a touchscreen, or other such interface devices.

Program execution component 204 can be configured to compile and execute a user-defined control program 224 or executable interpreted code stored on the controller's memory 222. In various embodiments, the control program 224 can be written in any suitable programming format (e.g., ladder logic, sequential function charts, structured text, C++, Python, Javascript, etc.) and downloaded to the industrial controller 202. Typically, the control program 224 uses data values read by the industrial controller's analog and digital inputs as input variables, or received via network component 210, and sets values of the industrial device's analog and digital outputs (or sets values of networked outputs) in accordance with the control program instructions based in part on the input values.

GPID control component 206 can be configured to control a value of a control signal u based on measured error e using GPID control principles to be described in more detail herein. I/O control component 208 can be configured to control the electrical output signals of the industrial controller's digital and analog electrical outputs in accordance with the control program outputs, and to convert electrical signals on the industrial device's analog and digital inputs to data values that can be processed by the program execution component 204. Analog outputs that act as control signals to a plant or process can be controlled based on part on a target process parameter value set by the control program 224 and computations performed by the GPID control component 206 to keep the actual value of the process parameter in line with the desired value set by the program 224. Networking component 210 can be configured to exchange data with one or more external devices over a wired or wireless network using any suitable network protocol.

The one or more processors 220 can perform one or more of the functions described herein with reference to the systems and/or methods disclosed. Memory 222 can be a computer-readable storage medium storing computer-executable instructions and/or information for performing the functions described herein with reference to the systems and/or methods disclosed.

Figure 3:
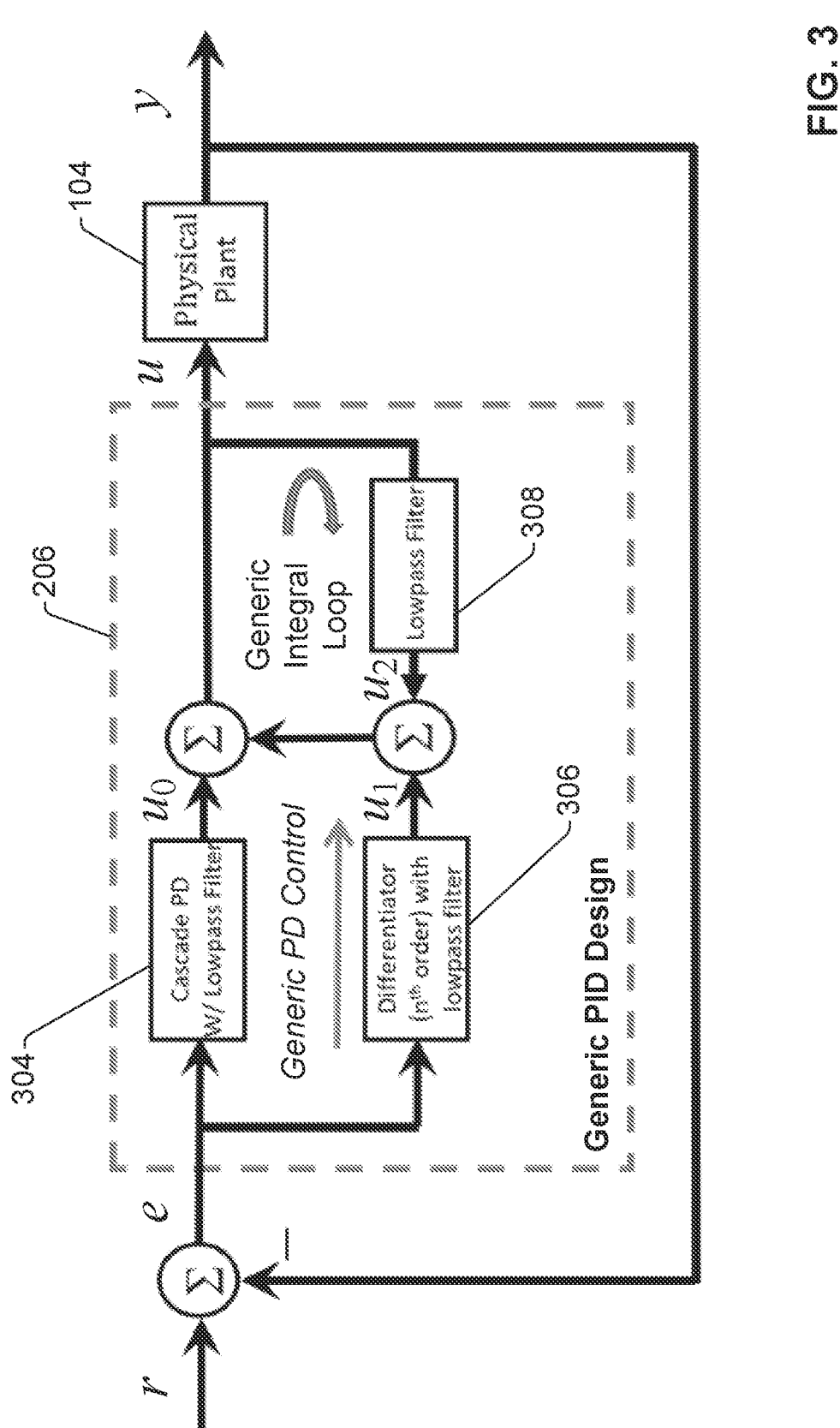
FIG. 3 is a diagram illustrating general principles of GPID design and control.

FIG. 3 is a diagram illustrating general principles of GPID design and control. In the generalized architecture depicted in FIG. 3, r is the reference signal generated by the controller's program execution component 204 based on execution of the industrial control program 224. Reference signal r indicates a desired target state, or a value of a controlled system variable, of the physical plant 104 (e.g., a speed, a position, a temperature, a pressure, etc.). Based on the reference signal r, the controller 202 generates and sends a control signal u to the physical plant 104 to drive the state of the plant 104 (or the value of the controlled system variable) to the desired state or value. Depending on the control system architecture, the control signal u may be sent by the I/O control component 208 or networking component 210 (e.g., via the controller's hardwired or networked I/O). The value of the control signal u is a function of the measured error e between the reference signal r and the measured plant output y (where the plant output y is the measured real value of the system variable or state being controlled by the signal u, which can be measured by a sensor and provided to the controller 202 via one of the controller's analog inputs or via a network connection).

The value of the control signal u is controlled by the GPID control component 206 based on the error e. The GPID component 206 implements a GPID design comprising a cascade lead compensator 304 (such as a cascade proportional-derivative (PD) controller) with a lowpass filter, an $n^{th}$ order differentiator 306 with a lowpass filter, and a generic integral loop comprising a lowpass filter 308. The error signal e is input to the cascade lead compensator 304 with low pass filter, which processes the error signal e to yield output $u_0$. The error signal e is also input to the differentiator 306 with lowpass filter, which processes the error signal e to yield output $u_1$. The control signal u is input to the lowpass filter 308, which processes the control signal u to yield output $u_2$. According to the principles of GPID control, the GPID control component 206 sets the value of the control signal u to be the sum of the output $u_0$ of the cascade lead compensator 304 with lowpass filter that processes error signal e, the output $u_1$ of the nth order differentiator 306 with lowpass filter applied to the error signal e, and the output $u_2$ of the lowpass filter 308 applied to the control signal u. That is, the control signal u is controlled according to $$u(t) = u_0(t) + u_1(t) + u_2(t) \qquad (1)$$

GPID, as implemented by the architecture of FIG. 3 and equation (1), is a quantitative generalization of PID technology, where the control action depends on information from past, present and future. This quantitative generalization can change the understanding, design, and tuning of controllers 202 in industrial applications of all areas of engineering and technology. For example, the use of lowpass filters in the cascade lead compensator 304 and the $n^{th}$ order differentiator 306 can limit the frequency range of the effect of the derivative and proportional terms of the control loop, thereby reducing or eliminating noise issues often associated with, in particular, the derivative term. Moreover, the GPID architecture illustrated in FIG. 3 eliminates the need to manually tune the proportional, integral, and derivative terms ($K_p$, $T_i$, and $T_d$) of the control loop in order to achieve good control performance. Instead, the bandwidths of the lowpass filters (lowpass filter 308, and the lowpass filters of the cascade lead compensator 304 and the $n^{th}$ order differentiator 306) are set based on the required bandwidth of the control loop. Consequently, a designer need only set the required bandwidth or the time constant, and no other parameter tuning is necessary. The architecture of FIG. 3 combines PD-like tracking error processing using the cascade lead compensator 304 with lowpass filter, high order differentiation of the tracking error using the $n^{th}$ order differentiator 306 with lowpass filter, and lowpass filtered u in place of pure integral action using lowpass filter 308.

Example mathematical implementations of the GPID design depicted in FIG. 3 are described below. These examples illustrate some of the underlying mathematical principles of GPID, and also present test data demonstrating performance benefits of GPID control. However, it is to be appreciated that industrial controllers 202 that support GPID control are not limited to these mathematical examples, and that any controllers that implement the general design illustrated in FIG. 3 are within the scope of one or more embodiments of this disclosure.

Figure 4:
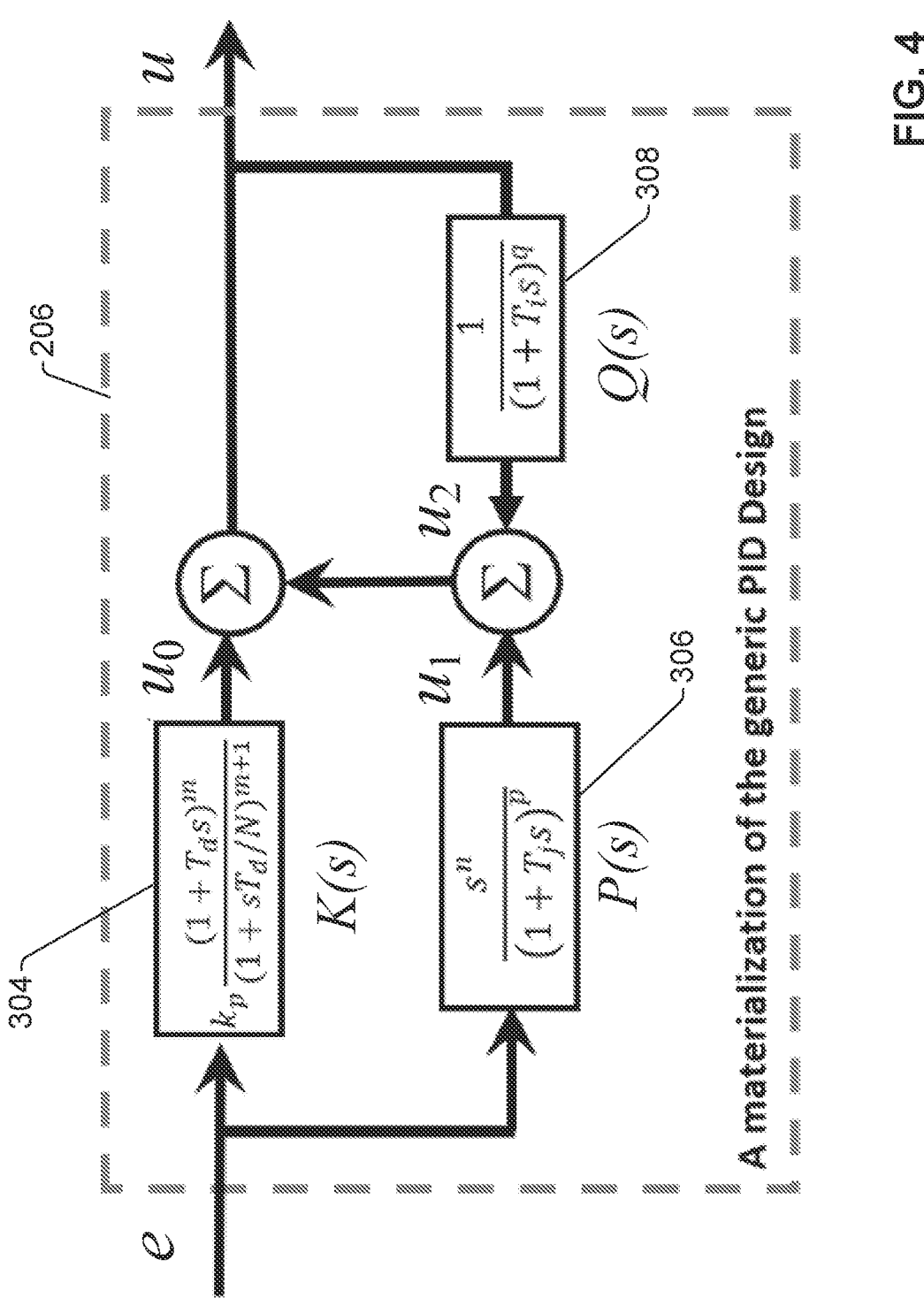
FIG. 4 is an example mathematical implementation of the GPID design.

FIG. 4 is an example mathematical implementation of the GPID design that can be implemented by the GPID control component 206 in one or more embodiments. In this example, it is assumed that the physical plant is of the form $y^{(n)}=f+bu$, where y is the plant output to be controlled, n is the given relative order, $f$ is an unknown function, and u is the plant input (control signal) with a given gain of b. The cascade lead compensator 304 (which may be a cascade PD or another form of lead compensator) has a transfer function K(s) (from e to $u_0$) of $$K(s) = k_p \frac{(1 + T_d s)^m}{\left(1 + sT_d/N\right)^{m+1}},$$

the differentiator 306 has a transfer function P(s) of $$P(s) = \frac{s^n}{(1 + T_j s)^p},$$

and the low pass filter 308 has a transfer function Q(s) of $$Q(s) = \frac{1}{(1 + T_i s)^q},$$

where $k_p$ is the proportional gain parameter, $T_d$ is the generic derivative time constant, $T_i$ is the integral time constant, $T_j$ is a time constant, and s is the LaPlace variable.

The present disclosure describes the GPID structure of FIG. 4, the materialization of this structure (where mathematical representations for each block of FIG. 3 are given), and how the controller parameters are determined first for the ideal integrator chain and then scaled for particular classes of plants. Specifically, the mathematical formula is given to calculate all controller parameters in FIG. 4 based on the requirements of the closed-loop phase margin and bandwidth.

The GPID design shown in FIGS. 3 and 4 is applicable to all areas of control design to force the output y of a physical plant or process (a dynamic system) to follow a prescribed variable r using the control signal u. The GPID control approach is applicable to all physical plants 104 of the form:

$$y^{(n)} = f + bu \qquad (2)$$

where n is the given relative order, $f$ is an unknown function, and b is the given input gain. For the purpose of illustration, however, the physical plants 104 can be commonly described as:

$$y^{(n)} = \sum_{i=0}^{n-1} a_i \cdot y^{(i)} + b \cdot u(t) + d(t) \qquad (3)$$

where $a_i$ (i=0, 1, . . . n−1) are plant parameters, d(t) represents the lumped effect of unknown and nonlinear dynamics, nonlinearity in the actuators, and external disturbance. The plant transfer function from u to y is:

$$G_p(s) = \frac{b}{s^n + \sum_{i=0}^{n-1} a_i s^i} \qquad (4)$$

For the sake of simplicity in illustration, and without the loss of generality, let reference signal r be a constant, and let the plant 104 be normalized with $$b = 1,$$

$$T_i = T_j,$$

$$p = q = n + 1, \text{ and}$$

$$m = n - 1.$$

The inner working of GPID, as shown in FIGS. 3 and 4, can be seen from its equivalent transfer function (from e to u) in which the parameters of the cascade lead compensator 304 with lowpass filter are $$u_0 = K(s)e \qquad (5)$$

$$K(s) = k_p \frac{(1 + T_d s)^m}{\left(1 + sT_d/N\right)^{m+1}} \qquad (6)$$

$$u = K(s)C(s)e = \left[ k_p \frac{(1 + T_d s)^m}{\left(1 + \dfrac{sT_d}{N}\right)^{m+1}} \right] \left[ \frac{(1 + T_i s)^{n+1}}{s^n G_p(s) + (1 + T_i s)^{n+1} - 1} \right] e \qquad (7)$$

where $$C(s) = \frac{(1 + T_i s)^{n+1}}{s^n G_p(s) + (1 + T_i s)^{n+1} - 1} \cong \frac{1}{s^n G_p(s)} \qquad (8)$$

in the frequency range where, for example, $\omega \ll 1/T_i$. Contained in C(s) is an approximate inverse of the plant transfer function—that is, the dynamics of the plant are inverted by the combination of signals $u_1$ and $u_2$ from differentiator 306 and lowpass filter 308—which normalizes the transfer function between $u_0$ and y to be an ideal integrator chain. This makes the loop gain transfer function $$L(s) = G_{PID}(s)G_p(s) = K(s)[C(s)G_p(s)] \cong K(s)\frac{1}{s^n} \qquad (9)$$

which can be readily determined based on the bandwidth and phase margin requirements, as demonstrated in the following case study.

Consider a class of $1^{st}$ order plants in the form of:

$$G_p(s) = \frac{1}{s + a_0} \qquad (10)$$

$$a_0 = T_p^{-1} \qquad (11)$$

where $\alpha_0$ and $T_p$ are the system bandwidth and time constant, respectively. In this case, $$T_i = T_j = \frac{\gamma}{\omega_c} < T_p,$$

where $\omega_c$ is the desired system bandwidth and $\gamma=0.1$.

For the ideal integrator plant of 1/s with the normalized loop gain crossover frequency of 1 radian per second (r/s), K(s) is $$K(s) = \frac{1.005}{1 + 0.1 \text{ s}} \qquad (11)$$

such that K(s) for loop gain crossover frequency of $\omega_c$ is:

$$K(s) = \frac{(1.005)\omega_c}{\left(1 + \dfrac{001}{\omega_c}s\right)} \qquad (12)$$

or let $$k_p = (1.005)\omega_c \qquad (13)$$

$$\frac{T_d}{N} = \frac{0.1}{\omega_c} \qquad (14)$$

$$T_a = \omega_c^{-1} \qquad (15)$$

and $$N = 10 \qquad (16)$$

Figure 5:
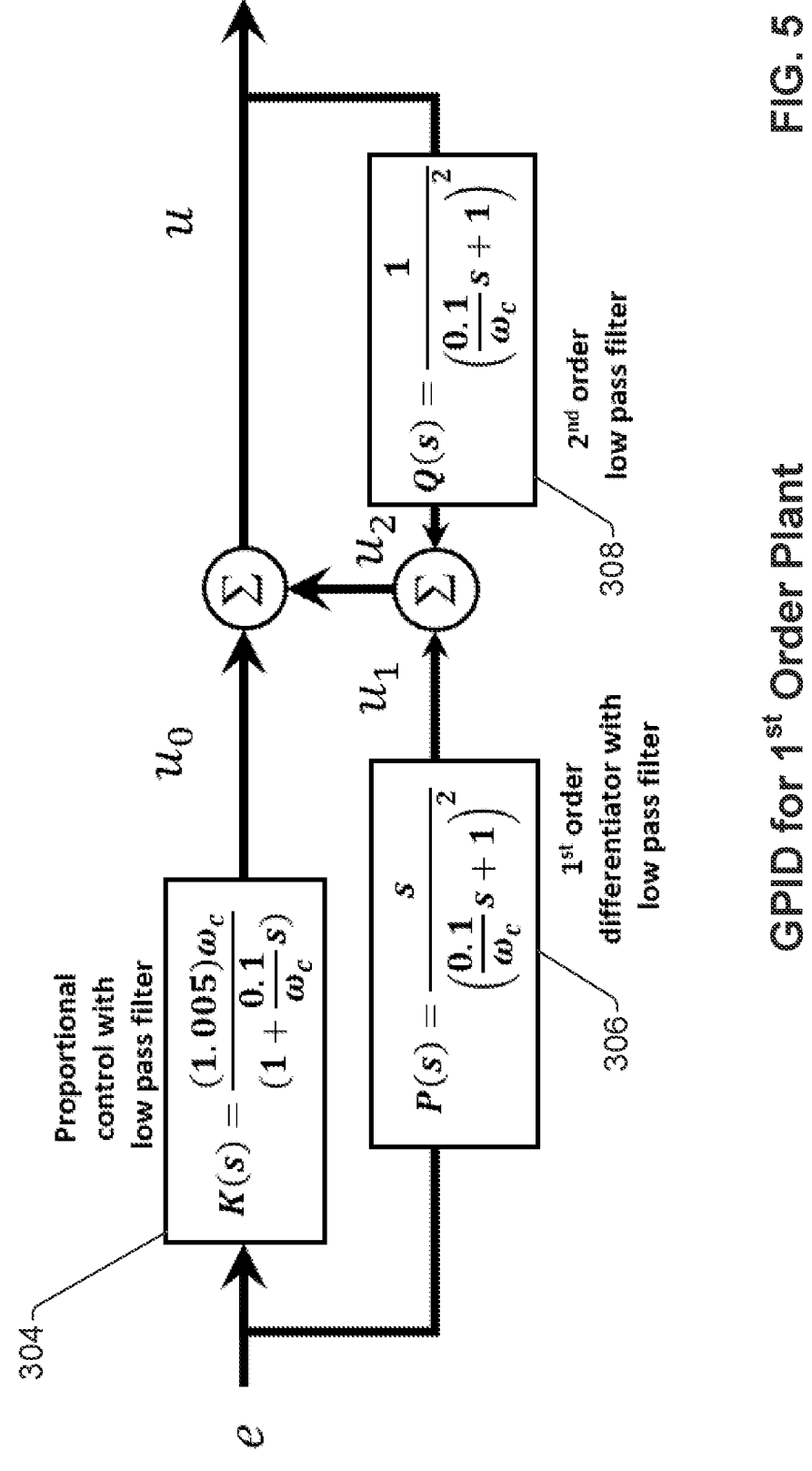
FIG. 5 is a block diagram of the GPID design for a $1^{st}$ order plant.
Figure 6A:
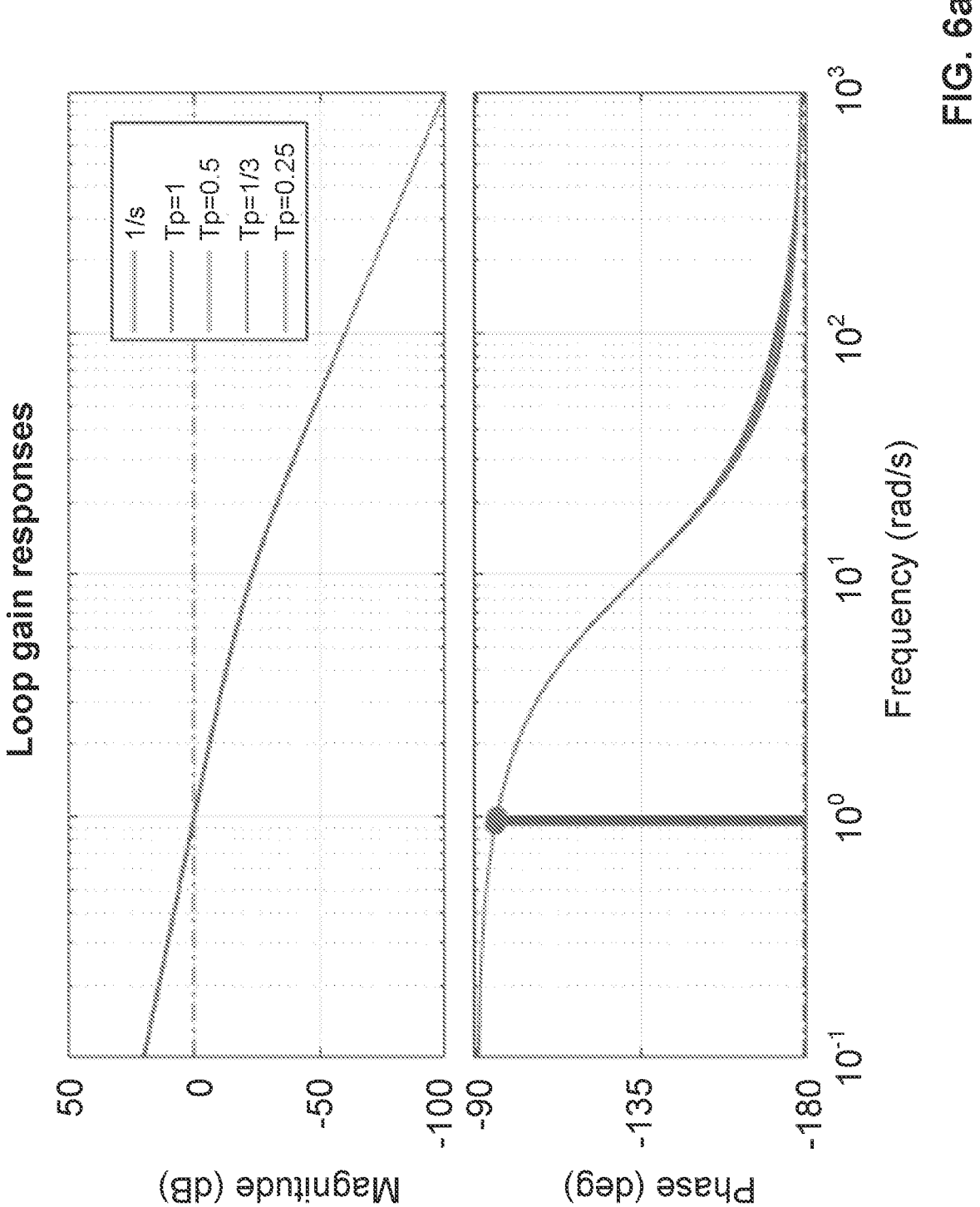
FIG. 6a illustrates plots of the magnitude and phase of a system loop gain $L(s)=G_{PID}(s) G_p(s)$ for a range of values of time constant $T_p$ for $\omega_c=1$ r/s.
Figure 6B:
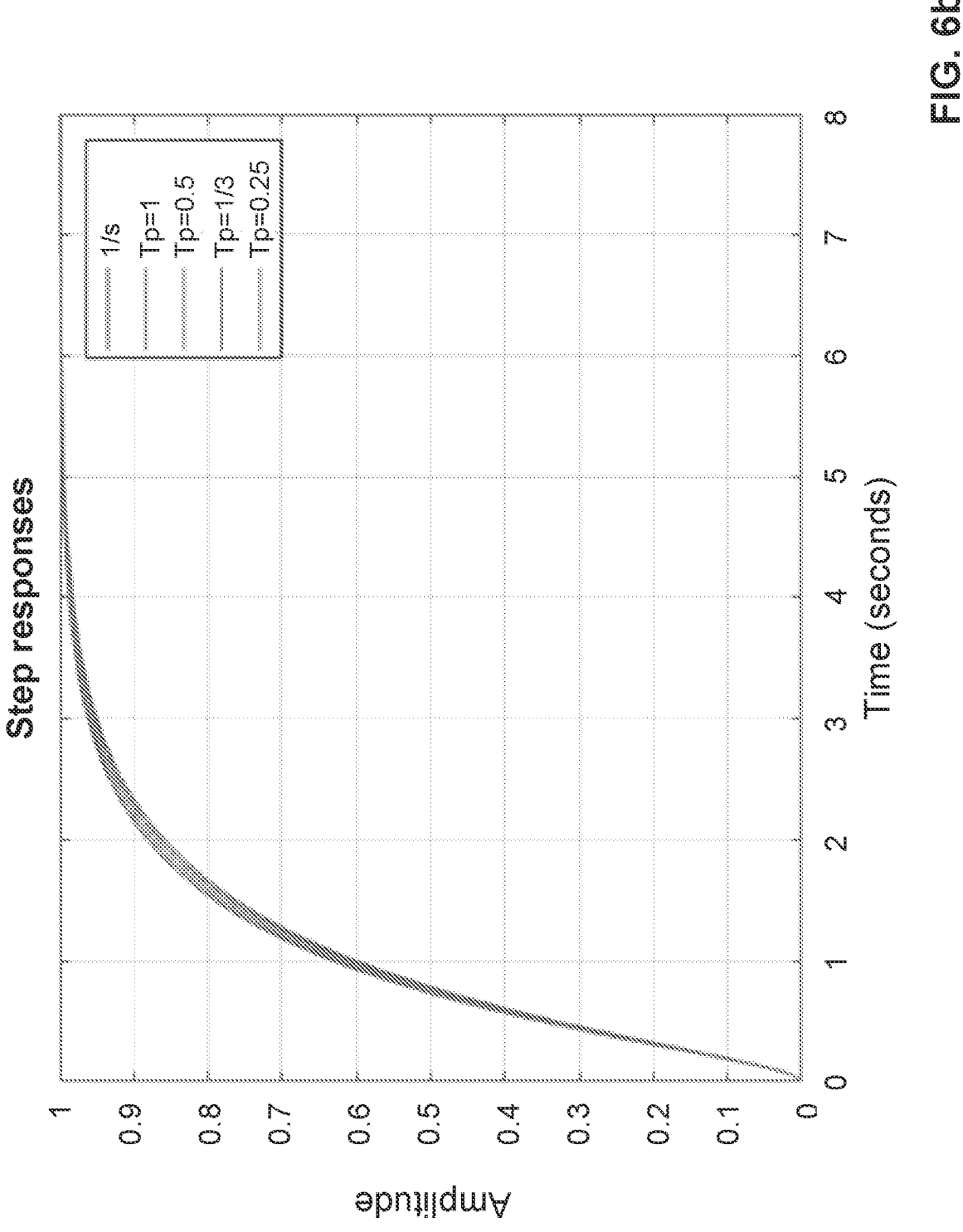
FIG. 6b is a plot of step responses for the range of values of $T_p$ for $\omega_c=1$ r/s.

FIG. 5 is a block diagram of the GPID design for a $1^{st}$ order plant. In this case, there is only one parameter-namely, the desired approximate system bandwidth $\omega_c$—to be selected by the designer. In some embodiments, the GPID control component 206 of an industrial controller 202 that supports GPID can render a configuration interface on a client device that allows the user to enter a desired approximate control system bandwidth $\omega_c$ (or, alternatively, a separate controller programming platform can be interfaced with the controller 202 to set the bandwidth $\omega_c$), and the GPID control component 206 can automatically tune the control system by automatically setting the values of $k_p$, $T_d$, and $T_i$ for the cascade lead compensator 304 with lowpass filter, the differentiator 306 with lowpass filter, and lowpass filter 308 based on the entered bandwidth $\omega_c$ (e.g., based on equations (13)-(16)). FIG. 6a illustrates plots of the magnitude and phase of the system loop gain $L(s)=G_{PID}(s) G_p(s)$ for a range of values of time constant $T_p$ for $\omega_c=1$ r/s. FIG. 6b is a plot of step responses for the range of values of $T_p$ for $\omega_c=1$ r/s.

Figure 7A:
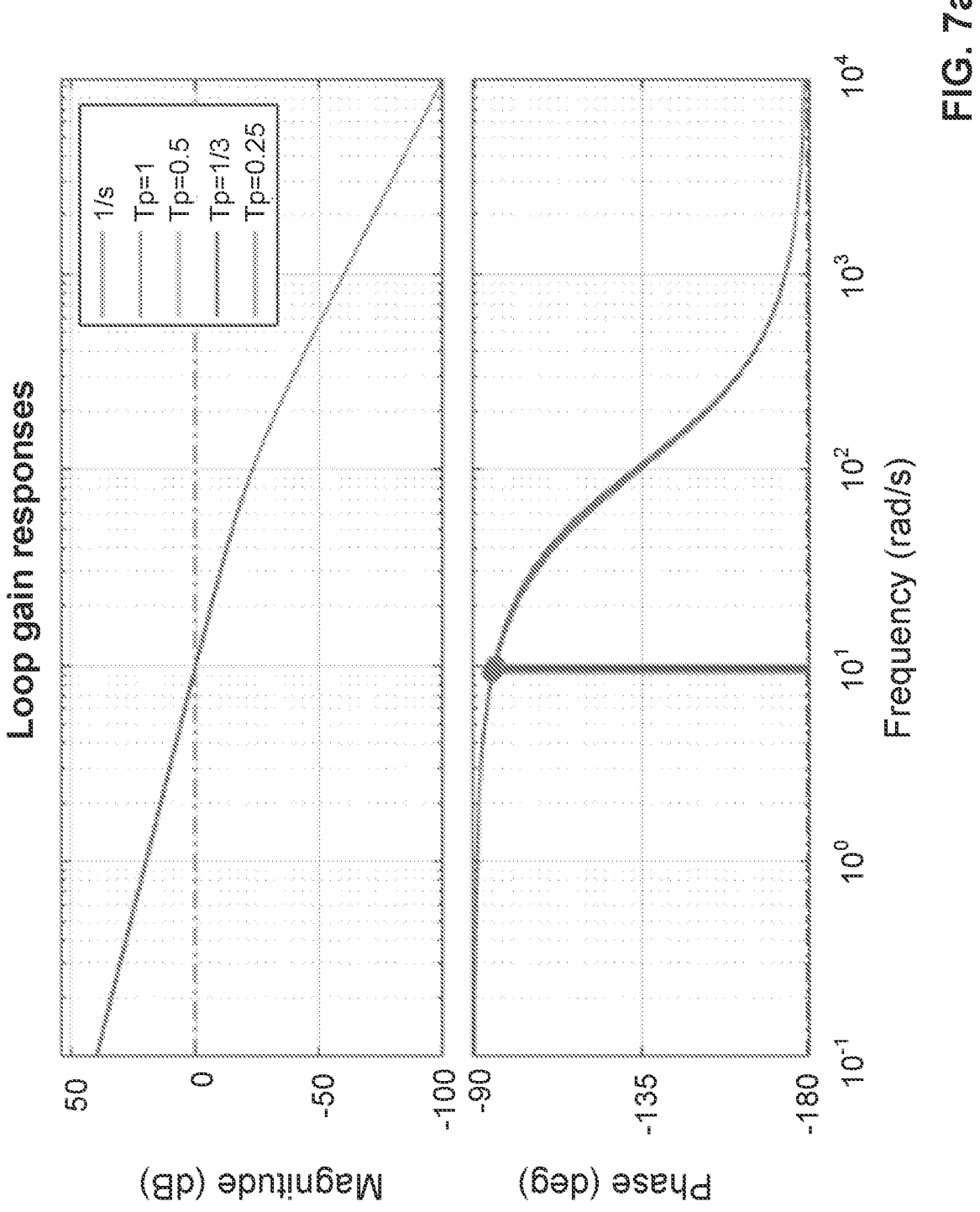
FIG. 7a illustrates plots of the magnitude and phase of the system loop gain $L(s)=G_{PID}(s) G_p(s)$ for the range of values of time constant $T_p$ for $\omega_c=10$ r/s.
Figure 7B:
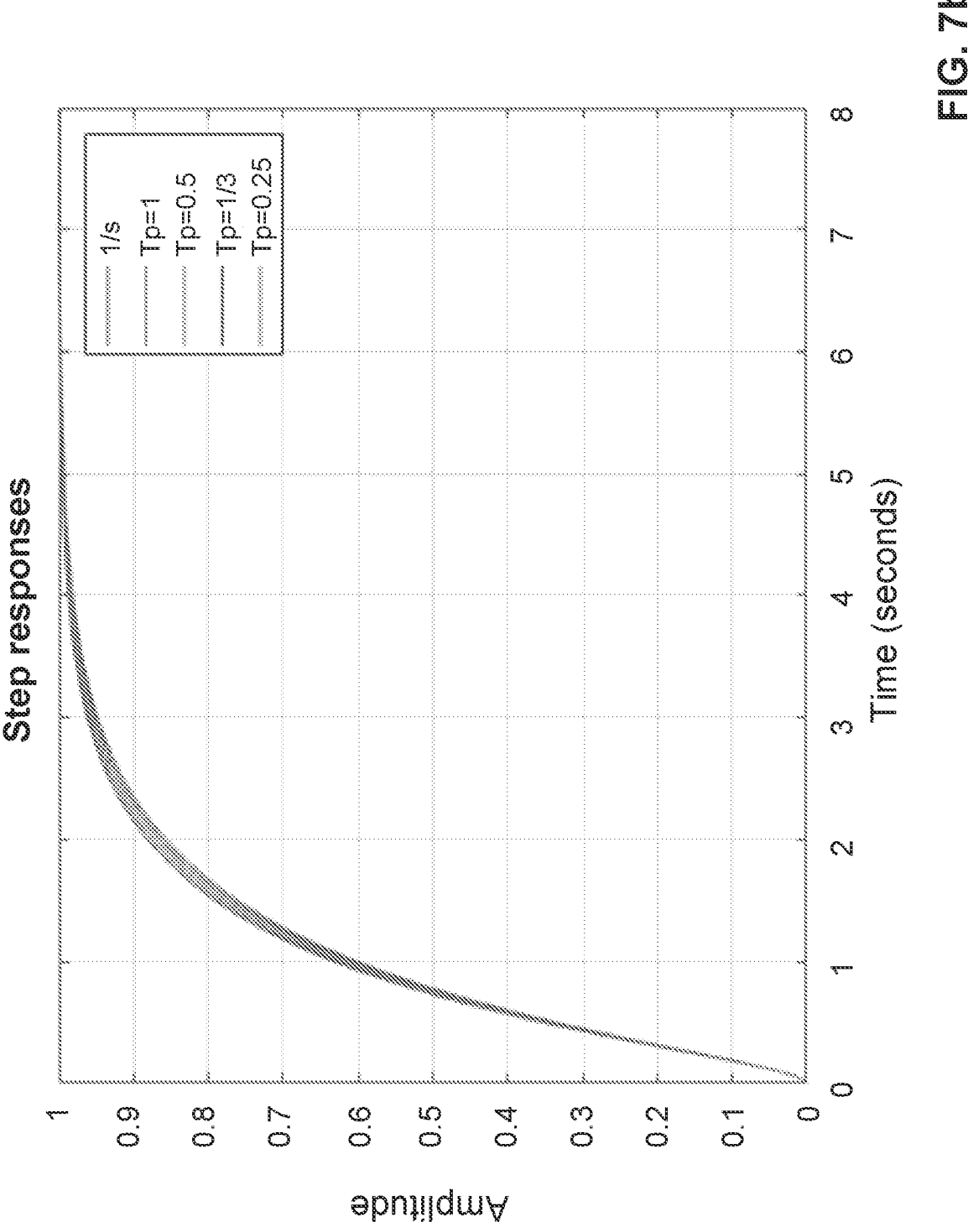
FIG. 7b a plot of step responses for the range of values of $T_p$ for $\omega_c=10$ r/s.

In equation (12), let $\omega_c=10$ r/s and $T_i=T_j=0.01$. FIG. 7a illustrates plots of the magnitude and phase of the system loop gain $L(s)=G_{PID}(s) G_p(s)$ for the range of values of time constant $T_p$ for $\omega_c=10$ r/s. FIG. 7b is a plot of step responses for the range of values of $T_p$ for $\omega_c=10$ r/s. The system loop gain $L(s)=G_{PID}(s) G_p(s)$ and the step responses illustrated in FIGS. 6a-7b show that, with parameter variations of time constant $T_p$ between 0.25 and 1, and system bandwidth scaling of $\omega_c$ from 1 to 10 times of the normalized loop gain crossover frequency, consistent response is obtained in both frequency and time domains compared to the ideal integrator plant of 1/s.

Frequency response analysis and simulation results of GPID are now examined. With $$\omega_c = 10\,r/s,\ T_i = T_j = \frac{0.1}{\omega_c} = 0.01,$$

and $T_p$ varying between 0.25 and 1, C(s) for $G_p(s)$ is given as $$C(s) = \frac{(1 + 0.01\ s)^2}{sG_p(s) + (1 + 0.01\ s)^2 - 1} \tag{17}$$

and the enforced plant—that is, the plant under the enforcing effect of C(s)—is $$G_e(s) = C(s)G_p(s) \tag{18}$$

Figure 8:
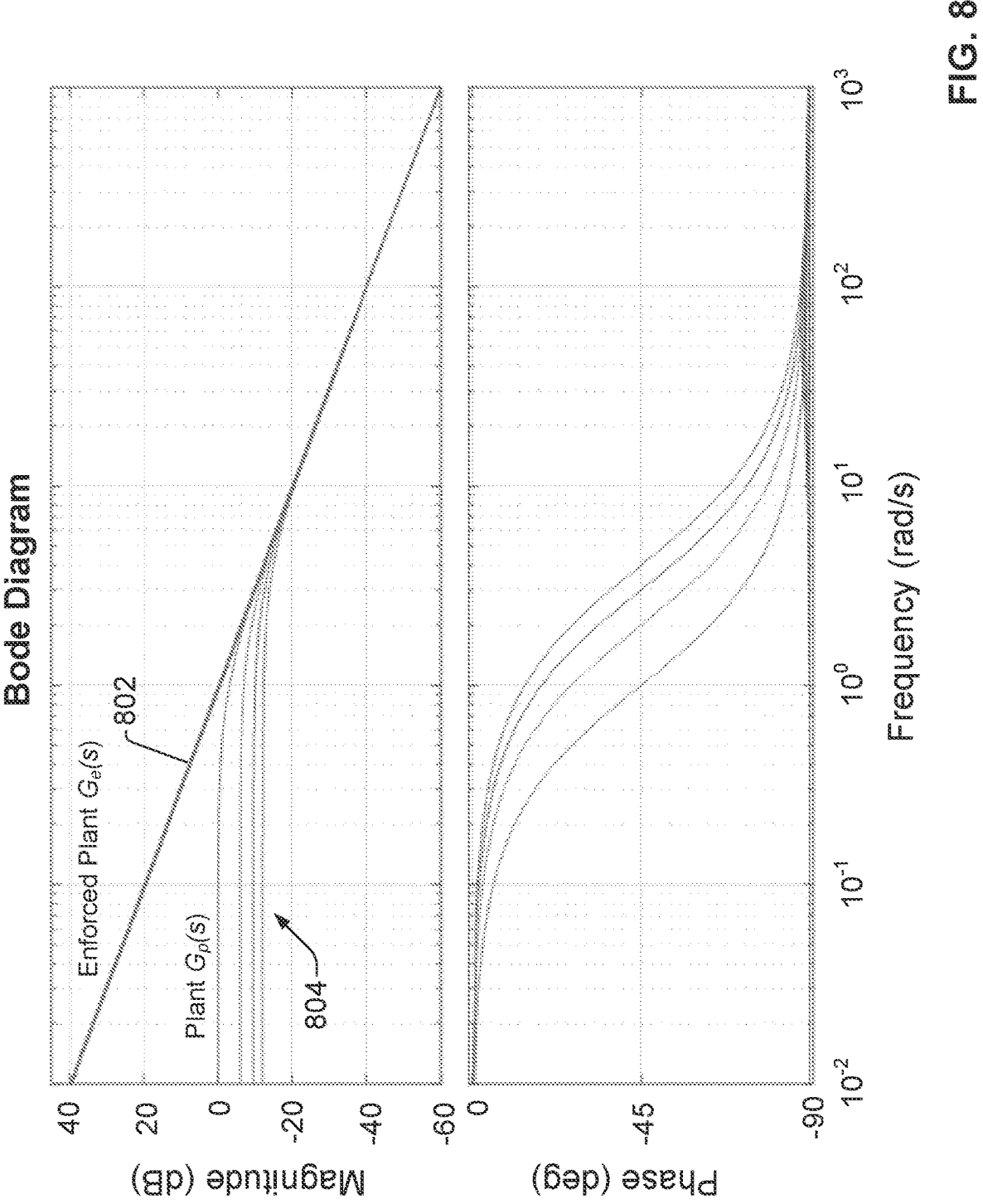
FIG. 8 illustrates plots of the magnitude and phase of the system loop gain for both an original plant $G_p(s)$ and an enforced plant $G_e(s)$ for a range of parameter values.

It is first verified whether the enforced plant—i.e., the transfer function $G_e(s)$ in (18)—is close to an ideal integrator plant without variations. To this end, FIG. 8 illustrates plots of the magnitude and phase of the system loop gain for both the original plant $G_p(s)$ (lines 804) and the enforced plant $G_e(s)$ (lines 802) for a range of parameter values. It can be concluded from these results that the enforced plant $G_e(s)$ is close to an ideal integrator plant without variations. While parameter variations in plant $G_p(s)$ cause gain variation up to 12 dB, the enforced ideal integrator plant $G_e(s)$ has a gain variation of up to 0.7 dB, a 94.2% reduction. This demonstrates that, with the enforcing effect of C(s), the design of K(s) based on 1/s is valid for $G_e(s)$ even with plant variation.

Figure 9A:
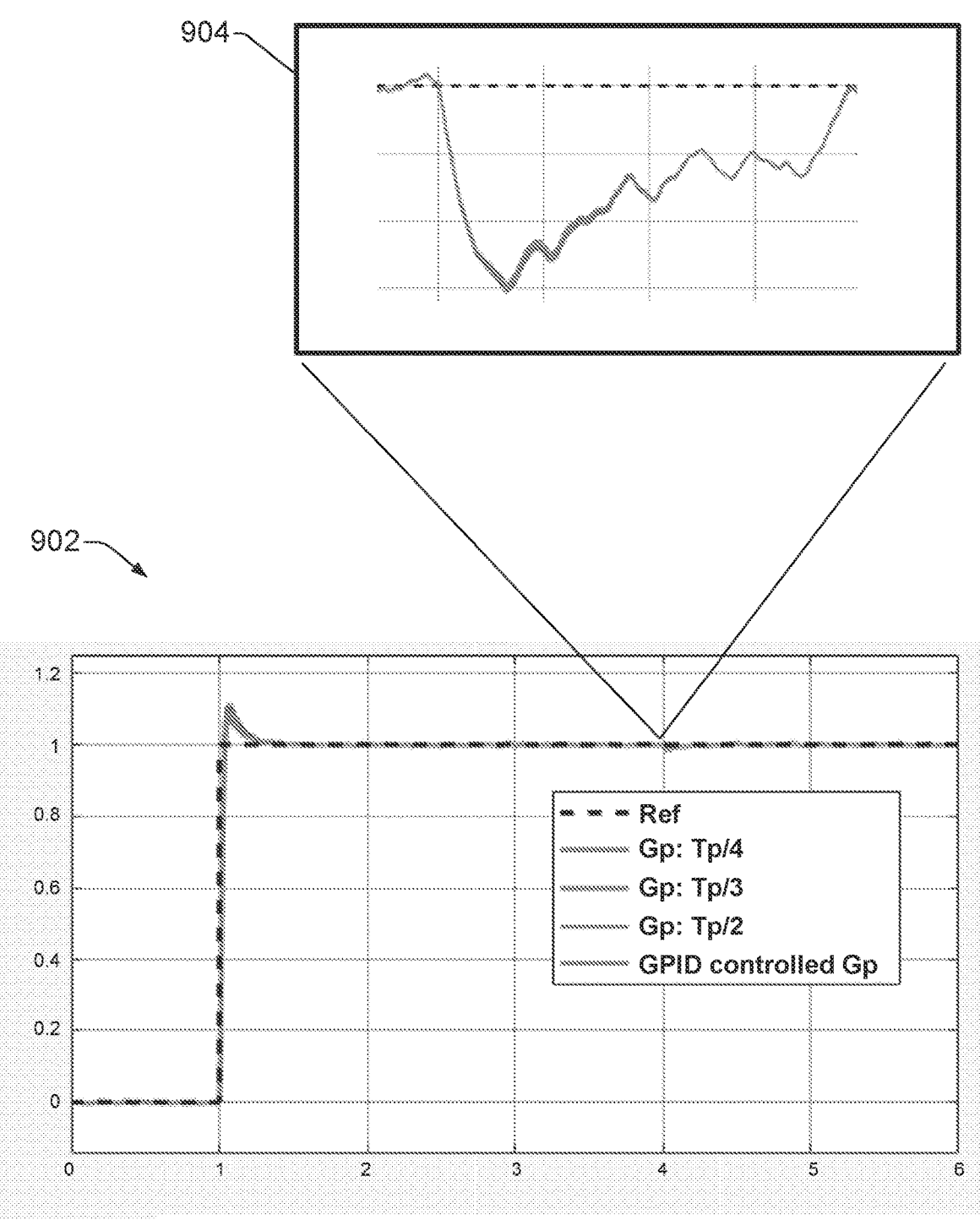
FIG. 9a is a graph of a simulation result of transient and steady state responses with setpoint tracking and disturbance rejection, with the input to a GPID differentiator from error e.
Figure 9B:
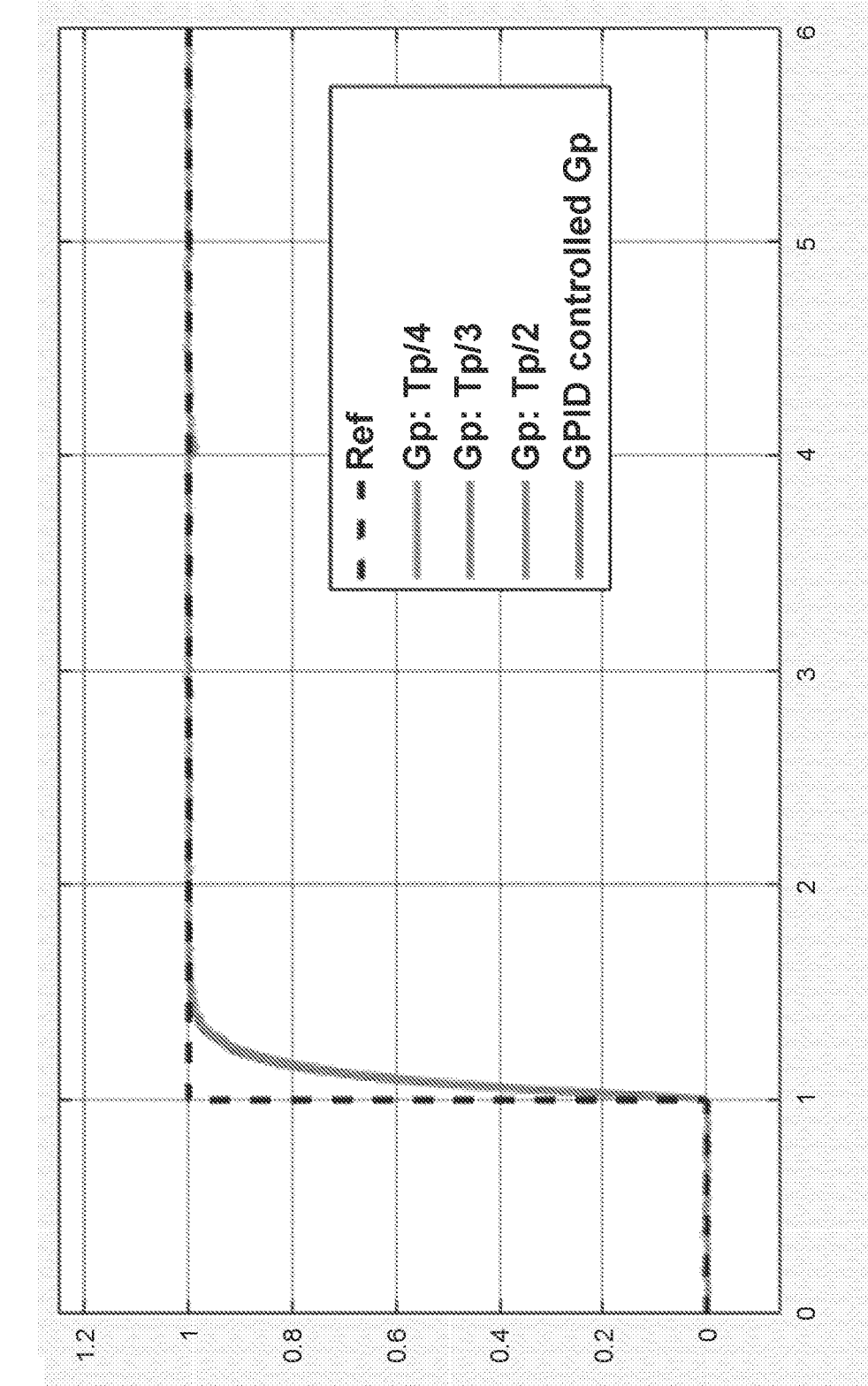
FIG. 9b is a graph of a simulation of transient and steady state responses with the input to the GPID differentiator from −y.

FIG. 9a is a graph 902 of a simulation result of transient and steady state responses with setpoint tracking and disturbance rejection, with the input to the differentiator 306 from error e. As shown in the detail graph 904, a step input with an amplitude of 100% of the setpoint is introduced at 4 seconds as the external disturbance. To avoid overshoot, the input to the differentiator 306 can be replaced by −y. FIG. 9b is a graph 906 of a simulation of transient and steady state responses with the input to the differentiator 306 from −y.

A case involving a $1^{st}$ order plant plus time-delay (FOPTD) system is now considered. A class of FOPTD system is given by $$G_p(s) = \frac{1}{s + a_0}e^{-sT_l} \tag{19}$$

$$a_0 = T_p^{-1} = 1 \tag{20}$$

$$T_l = 1 \tag{21}$$

where $T_l$ is the time-delay.

In this case, it is assumed that $$T_i = T_j = \frac{\gamma}{\omega_c} < T_p,$$

where $\omega_c$ the desired approximate system bandwidth and $\gamma$=0.1. For the ideal integrator plant of 1/s with time-delay $$\frac{e^{-sT_l}}{s},$$

and the normalized loop gain crossover frequency of 1 r/s, K(s) is given by $$K(s) = \frac{(1 + 10\ s)(0.1414)}{(1 + s)(1 + 0.1\ s)} \cdot g \tag{22}$$

where g is the gain to match the enforced plant gain responses of $$\frac{e^{-sT_l}}{s}$$

in low frequencies. Gain g is obtained with $T_i$ and $T_l$ as $$g = \sqrt{\frac{(T_i(-2 - T_i) - \cos(-T_l) + 1)^2 + \left(-T_i^2 + 1 + 2T_i - \sin(-T_l)\right)^2}{\left(-T_i^2 + 1\right)^2 + 4T_i^2}} \tag{23}$$

such that K(s) for loop gain crossover frequency of $\omega_c$ is $$K(s) = \frac{\left(1 + \frac{10}{\omega_c}s\right)(0.1414)}{\left(1 + \frac{1}{\omega_c}s\right)\left(1 + \frac{0.1}{\omega_c}s\right)} \cdot g\omega_c \tag{24}$$

or $$k_p = 0.1414 \cdot g\omega_c \tag{25}$$

$$\tau_a = 10\omega_c^{-1} \tag{26}$$

$$N = 10 \tag{27}$$

Figure 10:
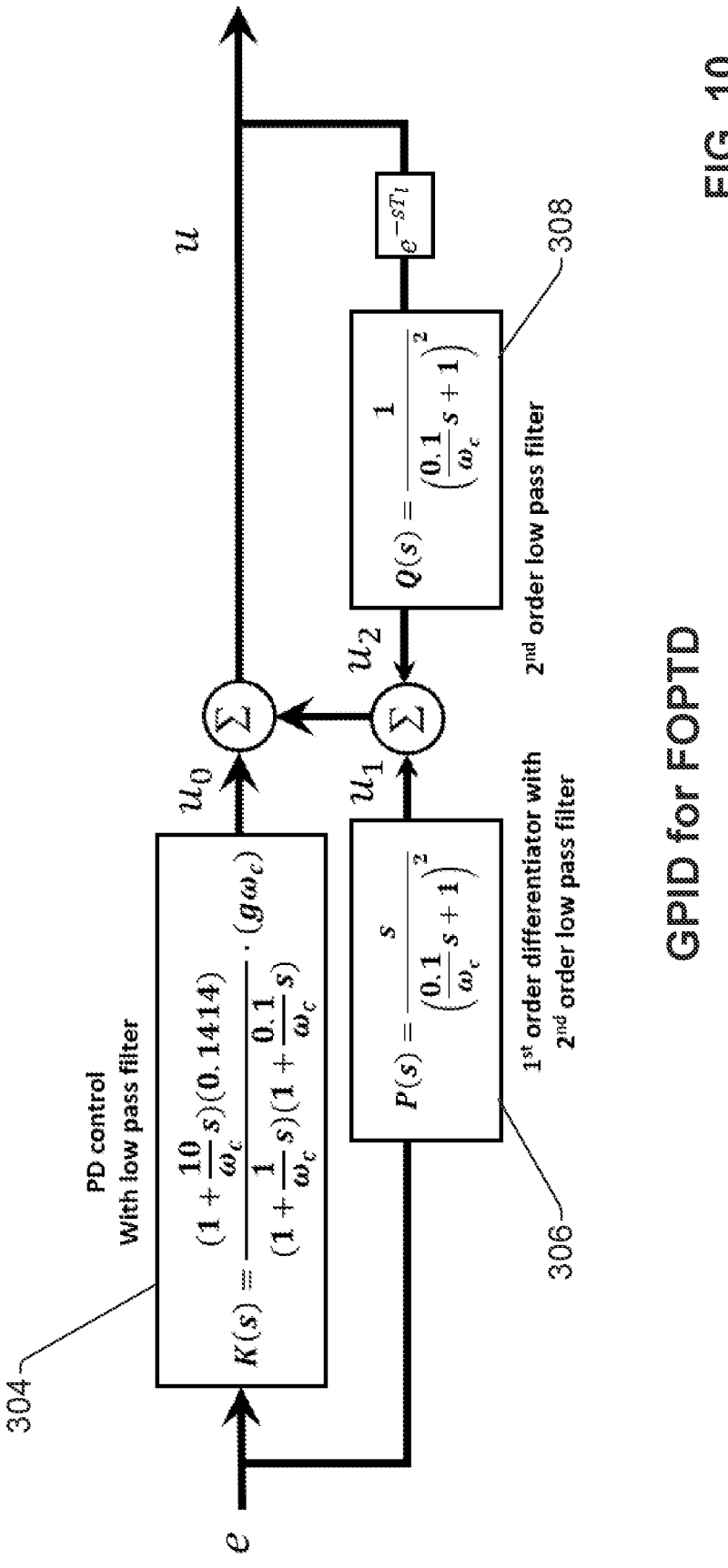
FIG. 10 is a block diagram of an example GPID design for a $1^{st}$ order plant plus time-delay (FOPTD).

FIG. 10 is a block diagram of an example GPID design for FOPTD. As in the case of a $1^{st}$ order plant, only the desired bandwidth $\omega_c$ is needed to tune the parameters of the cascade lead compensator 304, the differentiator 306, and the low-pass filter 308.

Frequency response analysis of GPID and simulation results for this example FOPDT case are now examined. With $T_i=T_j$=0.1 and $T_l$=1, C(s) for $G_p(s)$ is given as $$C(s) = \frac{(1 + 0.1s)^2}{s^1 G_p(s) + (1 + 0.1s)^2 - e^{-s}} \tag{28}$$

The enforced plant is given as $$G_e(s) = C(s)G_p(s) \tag{29}$$

Figure 11:
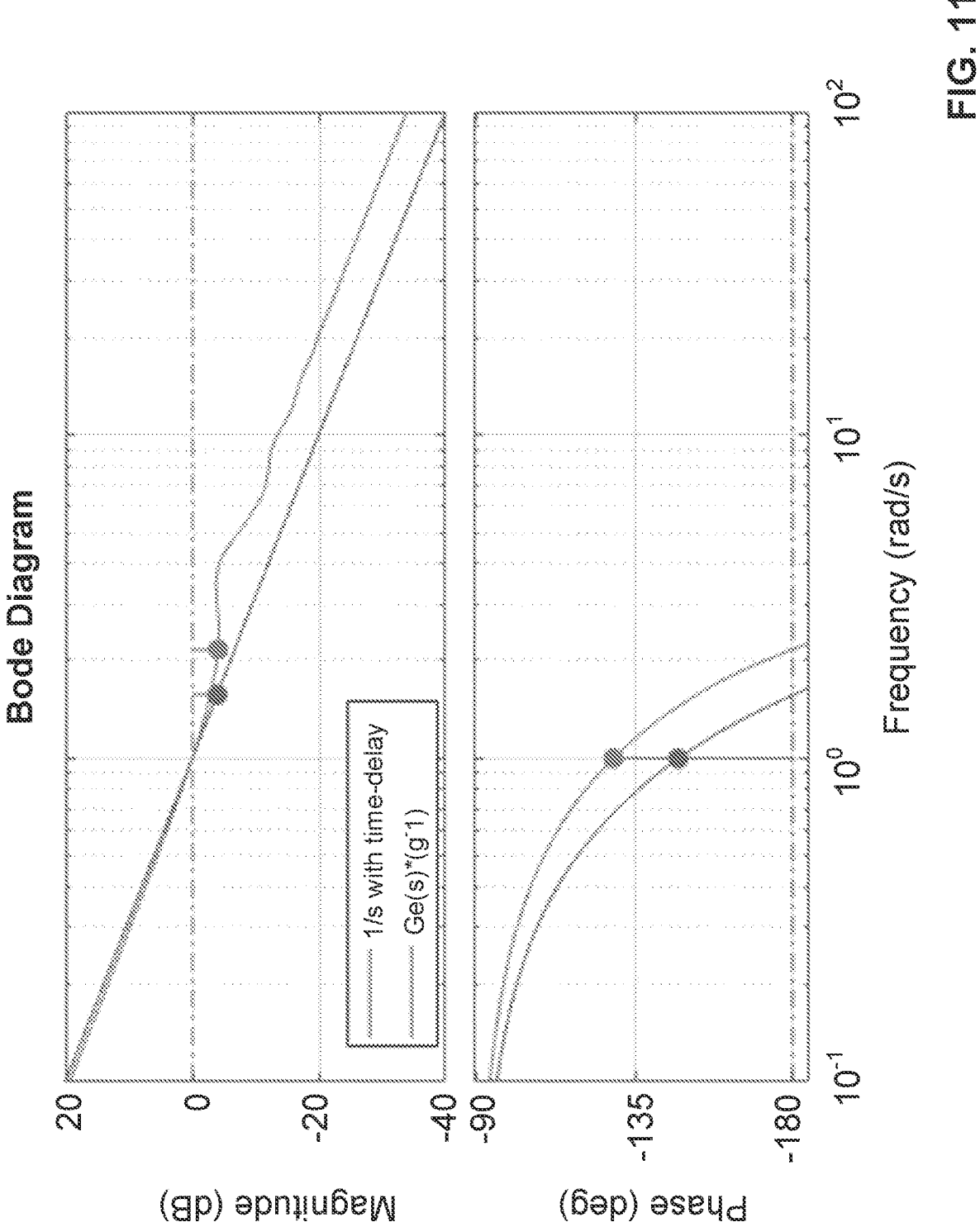
FIG. 11 is a Bode diagram that plots the magnitudes and phases of the responses of Ge(s)g and 1/s at low frequencies.

It is first verified if the enforced plant—i.e., the transfer function $G_e(s)g=2.0265\ G_e(s)$—is close to $$\frac{e^{-sT_l}}{s}$$

at low frequencies ($\omega < \omega_c$). FIG. 11 is a Bode diagram that plots the magnitudes and phases of the responses of $G_e(s)g$ and $1/s$ at low frequencies, which demonstrate that the enforced plant is close to $$\frac{e^{-sT_l}}{s}$$

at low frequencies.

In an example scenario, let $$\omega_c = 1r/s,\ \gamma = 0.1,$$

$$\omega_c = 1/2r/s,\ \gamma = \frac{0.1}{2},$$

and $$\omega_c = 1/3r/s,\ \gamma = \frac{0.1}{3},$$

respectively. By setting the normalized loop gain crossover frequency of $\omega_c$ at 1 r/s, the achievable system bandwidth is determined, as well as $T_i$=0.1 due to the time-delay. The desired system bandwidth should be slower than the achievable system bandwidth by the frequency scaling with improved system stability margins.

Figure 12:
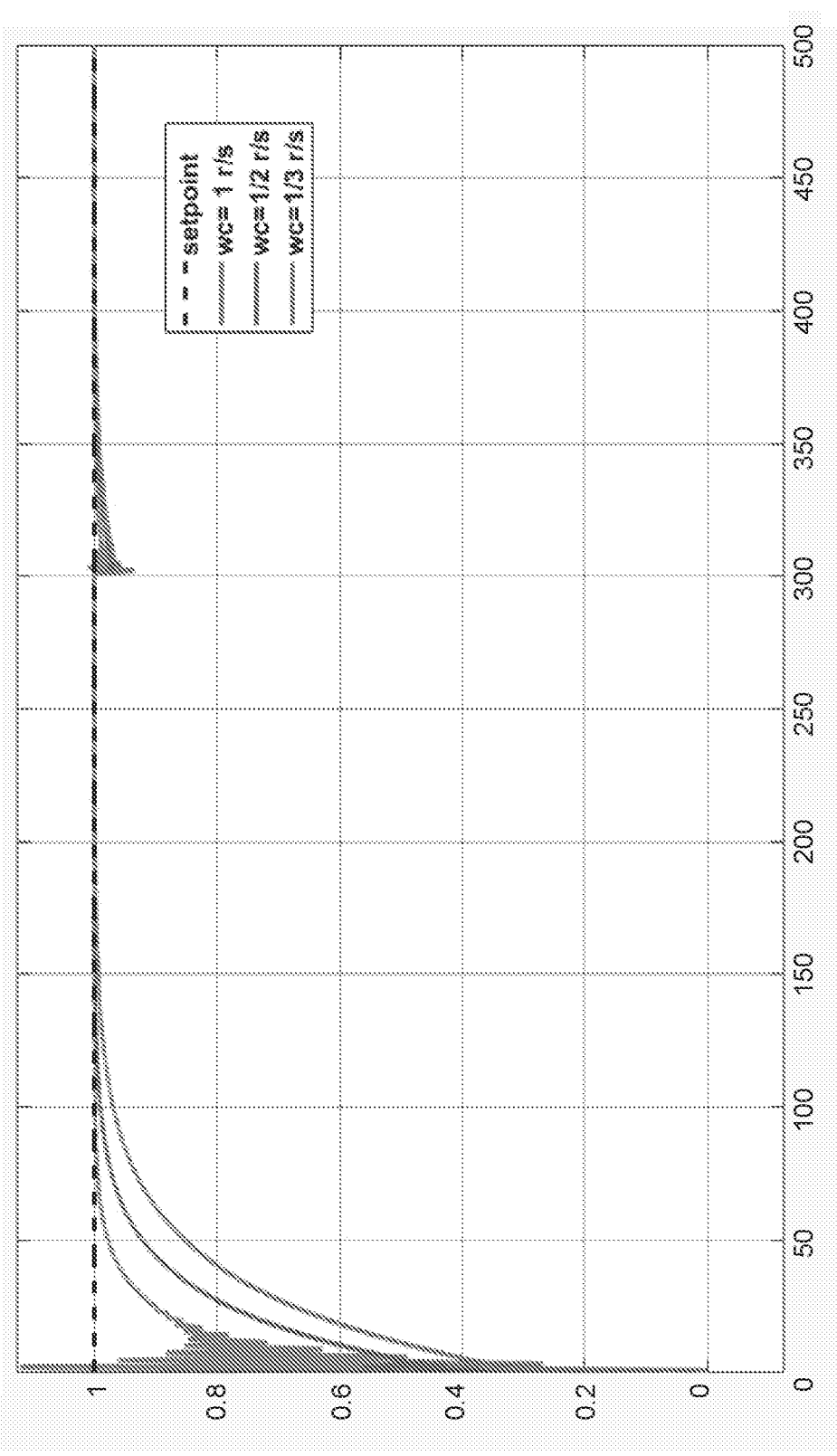
FIG. 12 is a graph that plots simulated responses for the GPID design for the FOPTD system with setpoint tracking and disturbance rejection for $\omega_c=1$ r/s, $\omega_c=\frac{1}{2}$ r/s, and $\omega_c=\frac{1}{3}$ r/s.
Figure 13A:
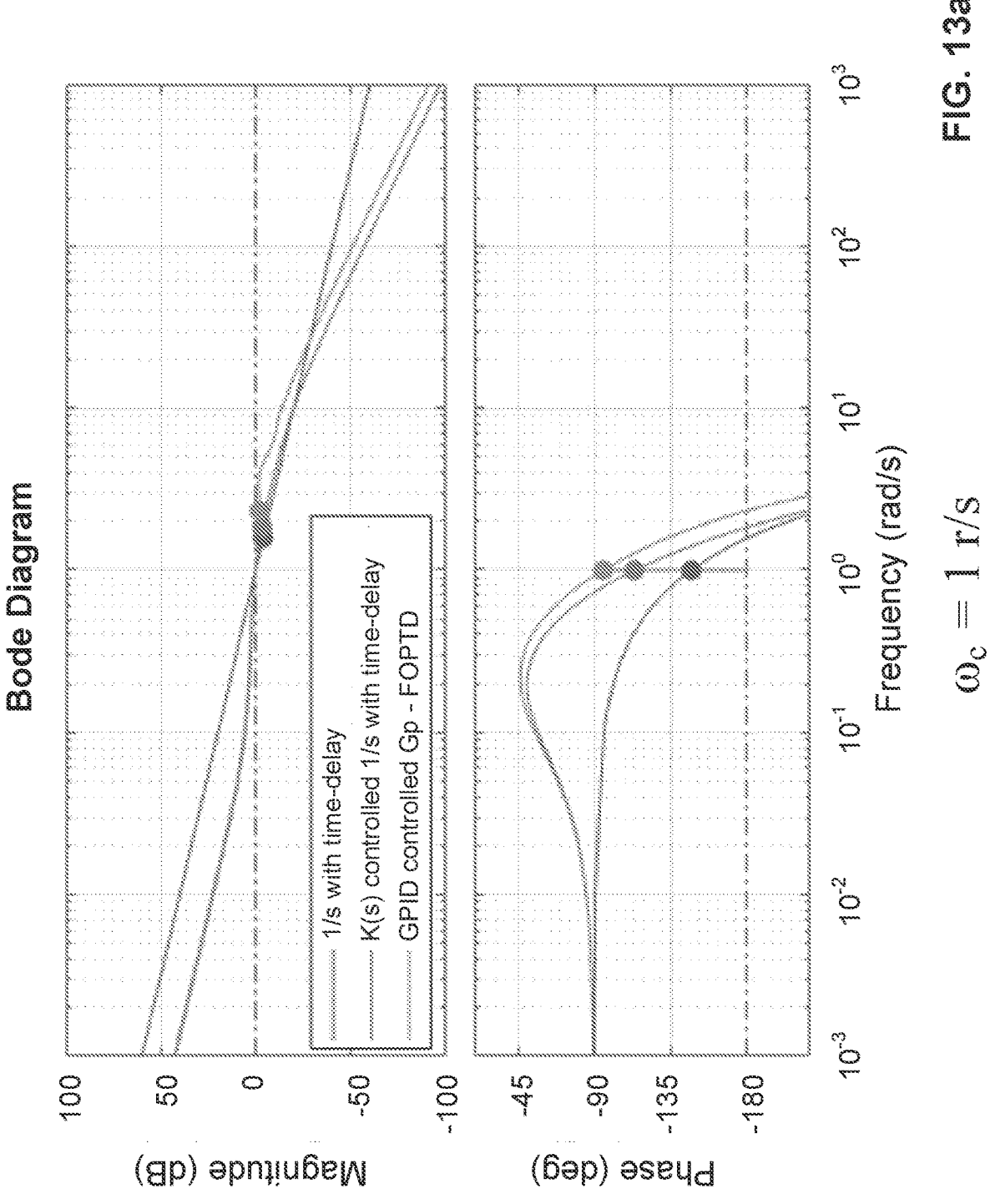
FIGS. 13a-13c are Bode diagrams that plot the simulated controlled loop gain responses of $e^{-sT_l}/s$, GPID controlled $e^{-sT_l}/s$, and Ge(s) with frequency scaling for $\omega_c=1$ r/s, $\omega_c=\frac{1}{2}$ r/s, and $\omega_c=\frac{1}{3}$ r/s, respectively.
Figure 13B:
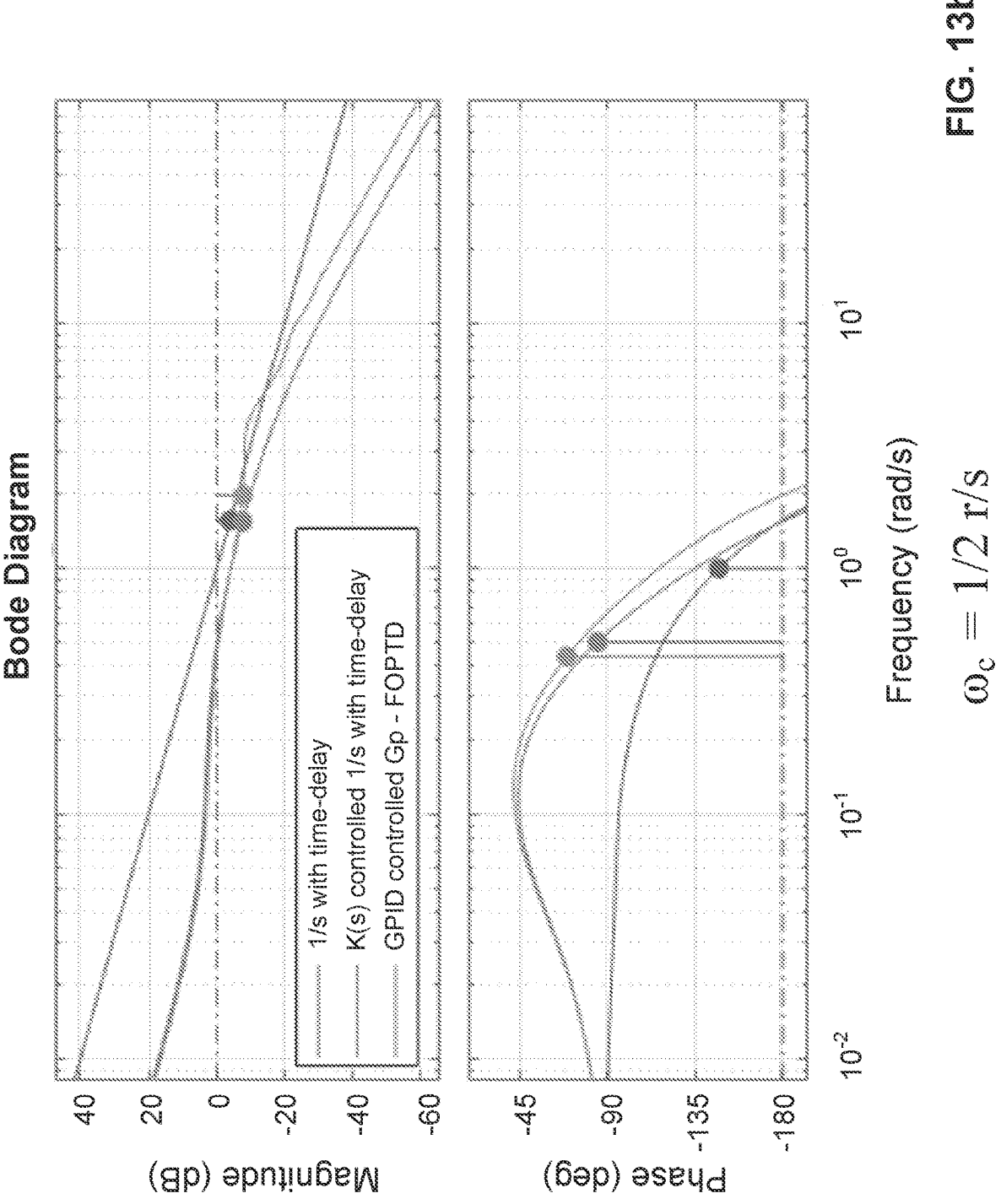
Figure 13C:
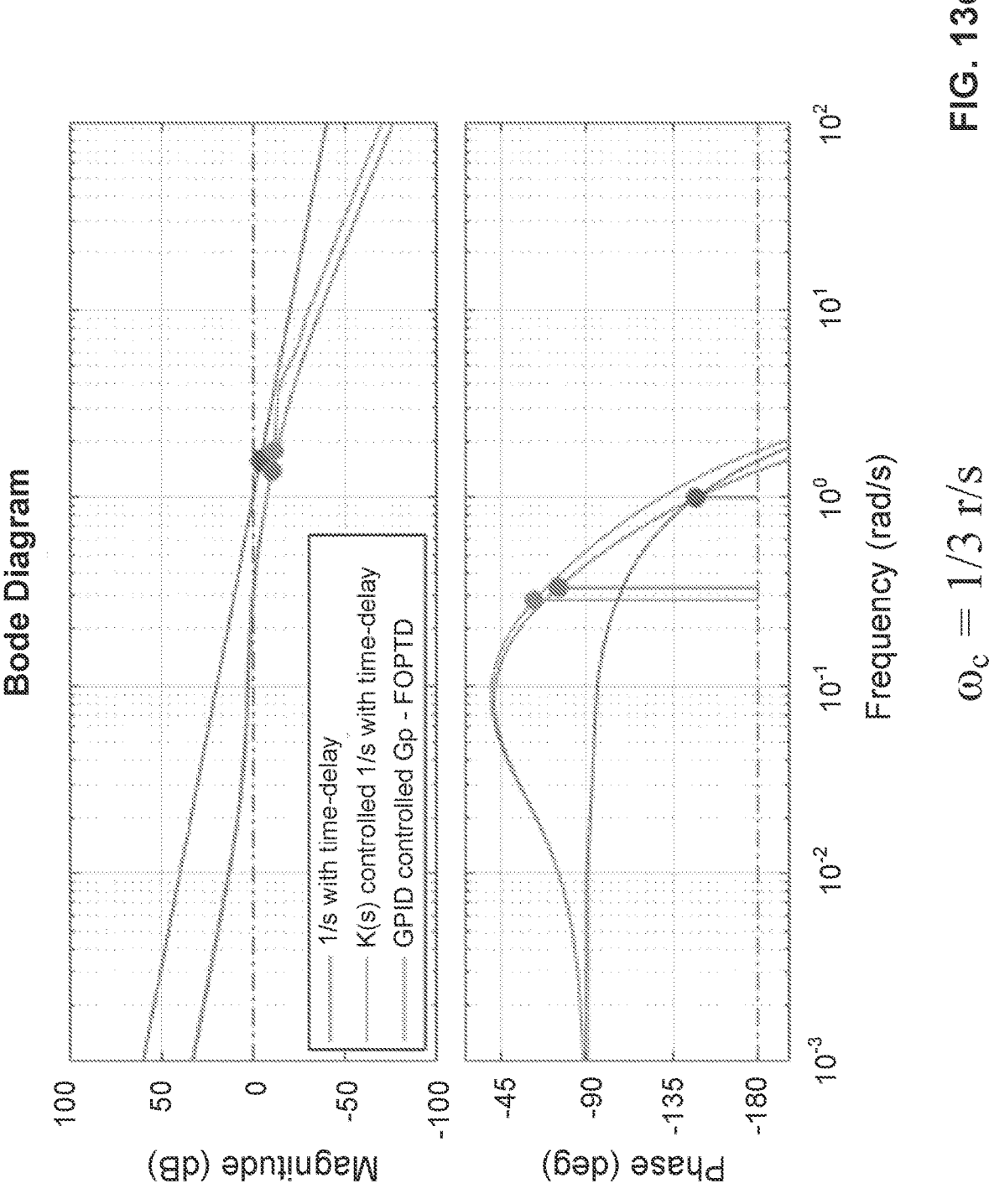

FIG. 12 is a graph that plots simulated responses for the GPID design for the FOPTD system with setpoint tracking and disturbance rejection for $\omega_c$=1 r/s, $\omega_c$=½ r/s, and $\omega_c$=⅓ r/s. FIGS. 13a-13c are Bode diagrams that plot the simulated controlled loop gain responses of $$\frac{e^{-sT_l}}{s},$$

GPID controlled $$\frac{e^{-sT_l}}{s},$$

and $G_e(s)$ with frequency scaling for $\omega_c$=1 r/s, $\omega_c$=½ r/s, and $\omega_c$=⅓ r/s, respectively. The input to the differentiator 306 is −y and consistent responses are obtained in both frequency and time domains.

Figure 14:
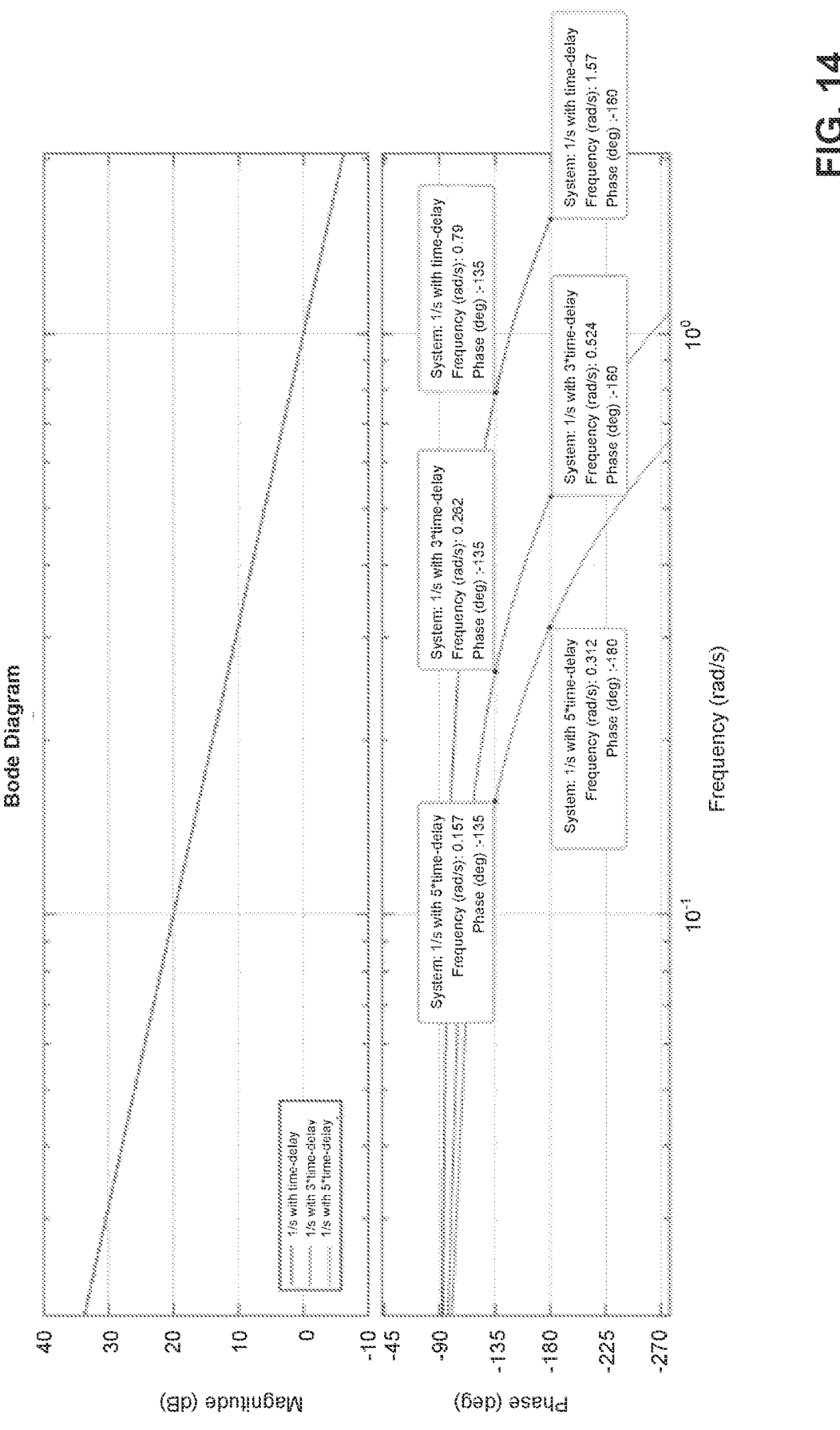
FIG. 14 is a Bode diagram showing the critical frequencies of $e^{-sT_l}/s$ with large time-delay.

The FOPTD system with a large time-delay $T_l > T_p$ is now considered. In industry, the time-delay is typically $T_l \in [3T_p, 5T_p]$. FIG. 14 is a Bode diagram showing the critical frequencies of $$\frac{e^{-sT_l}}{s}$$

with large time-delay. With the increasing $T_l$ the achievable system bandwidth is further restricted under the requirement of system stability margins.

The frequency at which the system becomes unstable can be calculated as $$\omega = \frac{\pi}{2T_l} \tag{30}$$

The frequency at which the system has required minimum phase margin $\emptyset_{min}$ can be calculated as $$\omega = \frac{(90 - \emptyset_{min})\pi}{180T_l} \tag{31}$$

Figure 15A:
FIG. 15a is a graph that plots simulated responses of the GPID controlled $G_p(s)$ with frequency scaling assuming $\emptyset_{pm}=45°$ and $\omega_c=\omega=(90-\emptyset_{min})\pi/180\ T_l$ r/s.

For the plant of $$\frac{e^{-sT_l}}{s}$$

and the normalized loop gain crossover frequency of $$\omega = \frac{(90 - \emptyset_{min})\pi}{180T_l}r/s \tag{32}$$

with the same value of $T_i$=0.1, K(s) and C(s) are given in the same forms as that in (24) and (25)-(27), respectively. Only the normalized loop gain crossover frequency of $\omega_c$ is reselected under the restriction of the achievable system bandwidth and the required minimum phase margin $\emptyset_{pm}$. FIG. 15a is a graph that plots simulated responses of the GPID controlled $G_p(s)$ with frequency scaling assuming $\emptyset_{pm}$=45° and $$\omega_c = \omega = \frac{(90 - \emptyset_{min})\pi}{180T_l}r/s.$$

Figure 15B:
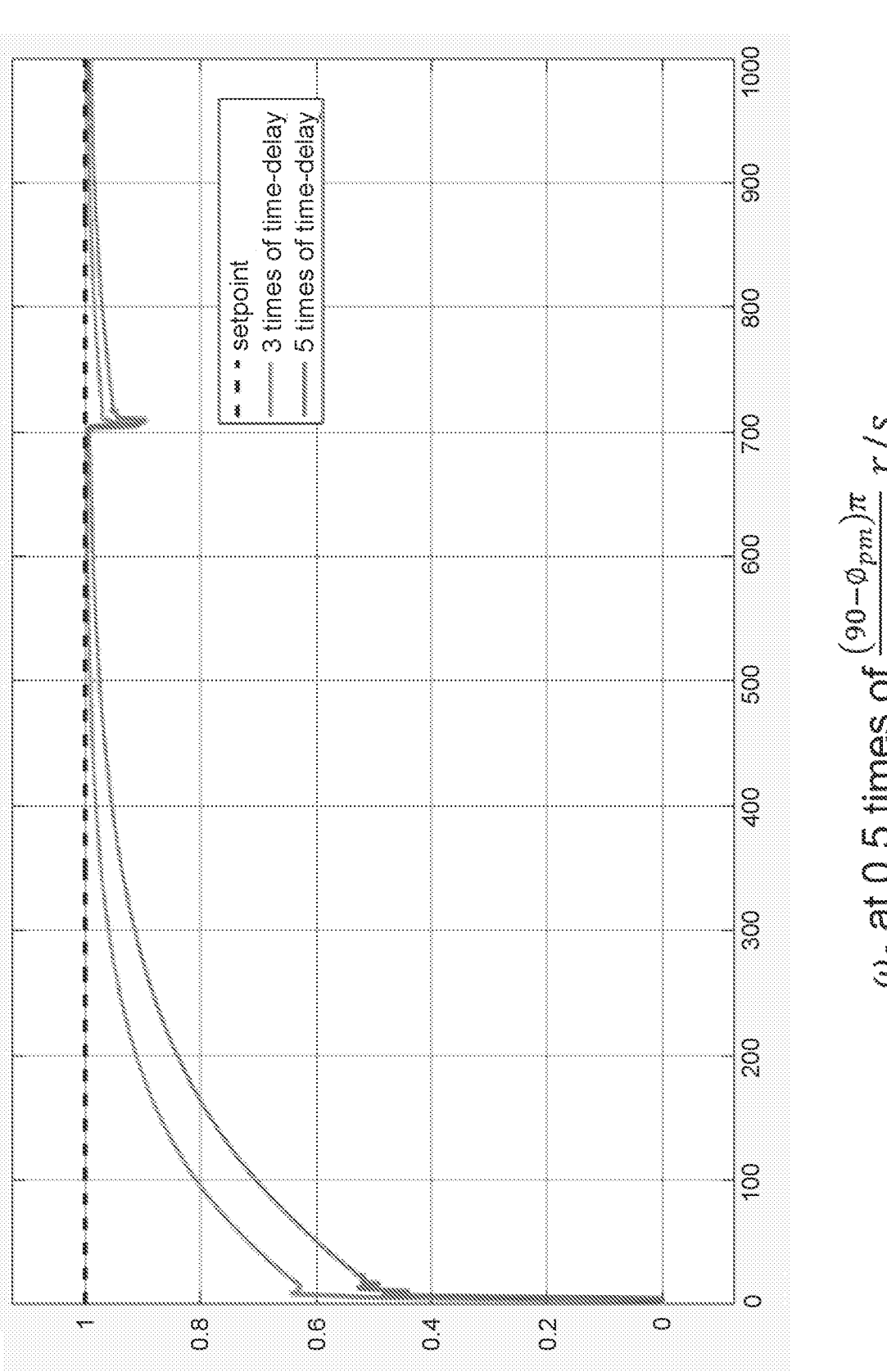
FIG. 15b is a graph that plots simulation results of the GPID controlled $G_p(s)$ with frequency scaling assuming $\emptyset_{pm}=45°$ and $\omega_c=\omega=(90-\emptyset min)\pi/180T_l$ r/s.

FIG. 15b is a graph that plots simulation results of the GPID controlled $G_p(s)$ with frequency scaling assuming $\emptyset_{pm}$=45° and $$\omega_c = \omega = 0.5\frac{(90 - \emptyset_{min})\pi}{180T_l}r/s.$$

Figure 16A:
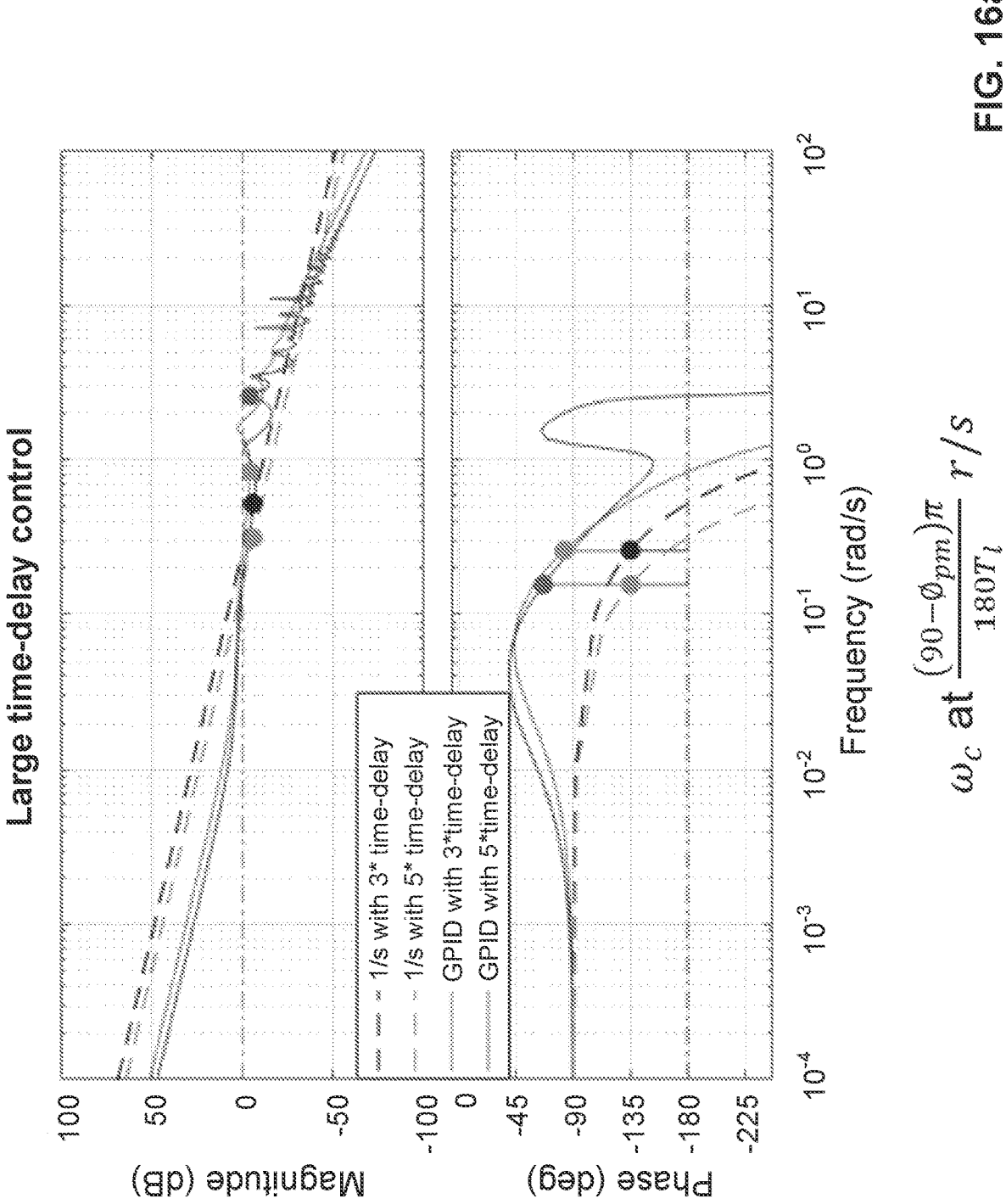
FIG. 16a is Bode diagram that plots loop gain characteristics of a GPID controlled $G_p(s)$ with frequency scaling for $\emptyset_{pm}=45°$ and $\omega_c=\omega=(90-\emptyset min)\pi/180T_l$ r/s.

FIG. 16a is Bode diagram that plots loop gain characteristics of the GPID controlled $G_p(s)$ with frequency scaling for $\emptyset_{pm}$=45° and $$\omega_c = \omega = \frac{(90 - \emptyset_{min})\pi}{180T_l}r/s.$$

Figure 16B:
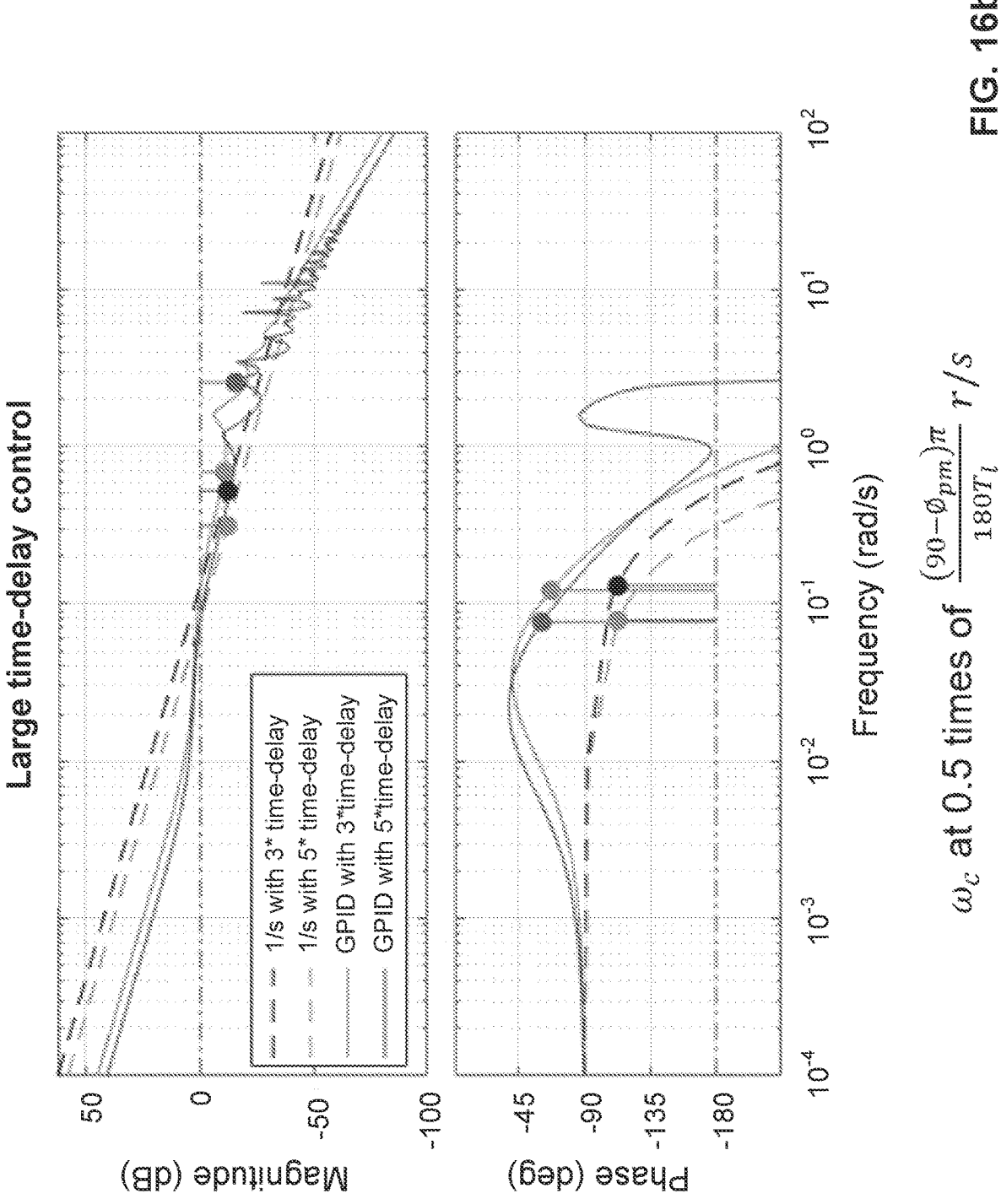
FIG. 16b is Bode diagram that plots loop gain characteristics of the GPID controlled $G_p(s)$ with frequency scaling for $\emptyset_{pm}=45°$ and $\omega_c=\omega=0.5\ (90-\emptyset_{min})\pi/180T_l$ r/s.

FIG. 16b is Bode diagram that plots loop gain characteristics of the GPID controlled $G_p(s)$ with frequency scaling for $\emptyset_{pm}$=45° and $$\omega_c = \omega = 0.5\frac{(90 - \emptyset_{min})\pi}{180T_l}r/s.$$

The conclusive results indicate that the system bandwidth must be sacrificed under a larger time-delay to guarantee the system stability margins.

A case involving motion control design with rigid body dynamics is now considered. A class of $2^{nd}$ order plant commonly seen in rigid body motion control is given by $$G_p(s) = \frac{1}{s(s + a_1)}, \tag{33}$$

$$a_1 = 1.41 \ (norminal)$$

where $a_1$ is the system high frequency pole.

In this case, $$T_i = T_j = \frac{\gamma}{\omega_c} < a_1^{-1}, \tag{34}$$

where $\omega_c$ is the desired approximate system bandwidth and $\gamma$=0.1 in general. For the ideal double integral plant of $1/s^2$ and the normalized loop gain crossover frequency of 1 r/s, the controller K(s) with phase margin of 35° and 45°, respectively, are given as $$K(s) = \frac{1.77s + 1}{(0.23s + 1)^2} \cdot (0.518)(\text{with phase margin of } 35°) \tag{34}$$

$$K(s) = \frac{2.5s + 1}{(0.2s + 1)^2} \cdot (0.386)(\text{with phase margin of } 45°) \tag{35}$$

Such that K(s) for loop gain crossover frequency of $\omega_c$ is $$K(s) = \frac{\left(\frac{1.77}{\omega_c}\right)s + 1}{\left(\left(\frac{0.23}{\omega_c}\right)s + 1\right)^2} \cdot (0.518)\omega_c^2 \ (\text{with phase margin of } 35°) \tag{36}$$

$$K(s) = \frac{\left(\frac{2.5}{\omega_c}\right)s + 1}{\left(\left(\frac{0.2}{\omega_c}\right)s + 1\right)^2} \cdot (0.386)\omega_c^2 \ (\text{with phase margin of } 45°) \tag{37}$$

In these cases, K(s) has only one parameter—i.e., the desired system bandwidth $\omega_c$—to be selected by the user.

Figure 17:
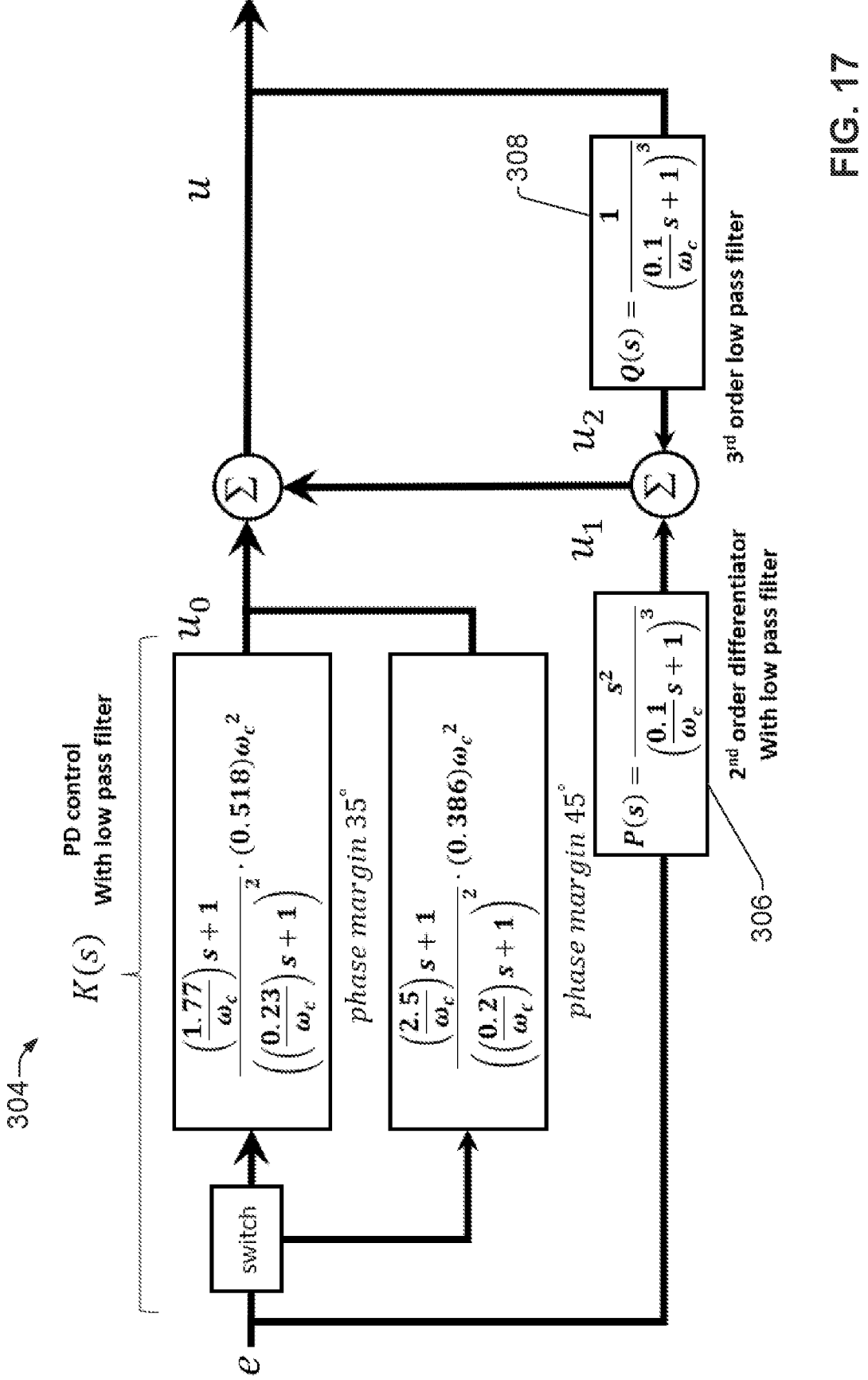
FIG. 17 is a block diagram of an example GPID design for a $2^{nd}$ order motion control plant with rigid body.

FIG. 17 is a block diagram of an example GPID design for a $2^{nd}$ order motion control plant with rigid body. Frequency response analysis and simulation results of this GPID design are now examined. Assuming $$\frac{a_1^{-1}}{T_i} = 28.4 \tag{38}$$

with $$T_i = T_j = 0.025,$$

yields for $G_p(s)$ $$C(s) = \frac{(1 + 0.025s)^3}{s^2 G_p(s) + (1 + 0.025s)^3 - 1}$$

and the enforced plant is given by $$G_e(s) = C(s)G_p(s) \tag{39}$$

Figure 18:
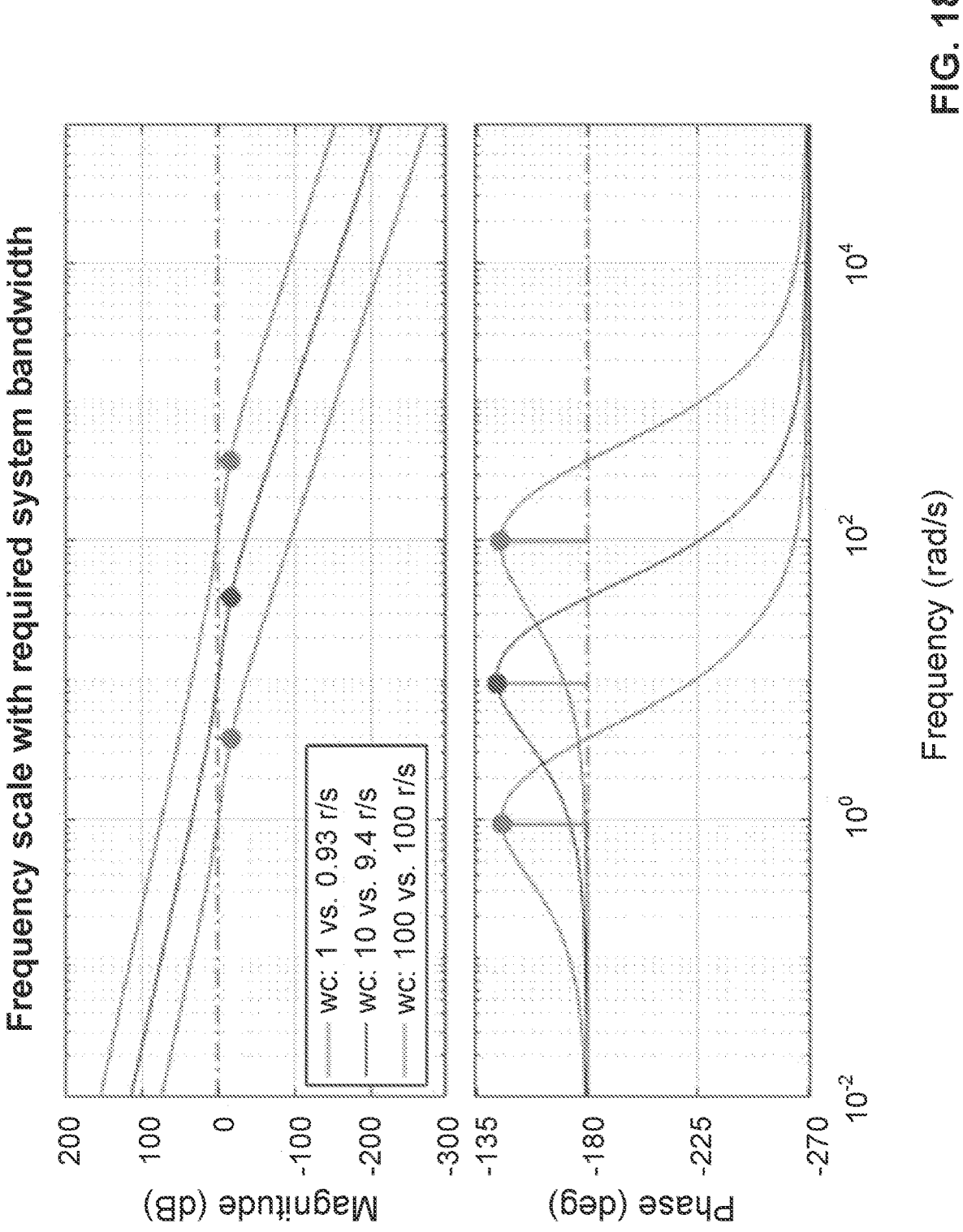
FIG. 18 is a Bode diagram plotting GPID loop gains $L(s)=K(s)G_e(s)$ with phase margin set at 35°.

FIG. 18 is a Bode diagram plotting the GPID loop gains $L(s)=K(s)G_e(s)$ with phase margin set at 35° for $$\omega_c = 1 \ r/s,$$

$$\gamma = 0.025,$$

$$\omega_c = 10 \ r/s,$$

$$\gamma = 0.25$$

and $$\omega_c = 100 \ r/s,$$

$$\gamma = 2.5,$$

respectively. The designed and actual crossover frequencies are shown in FIG. 18 to be close.

Figure 19A:
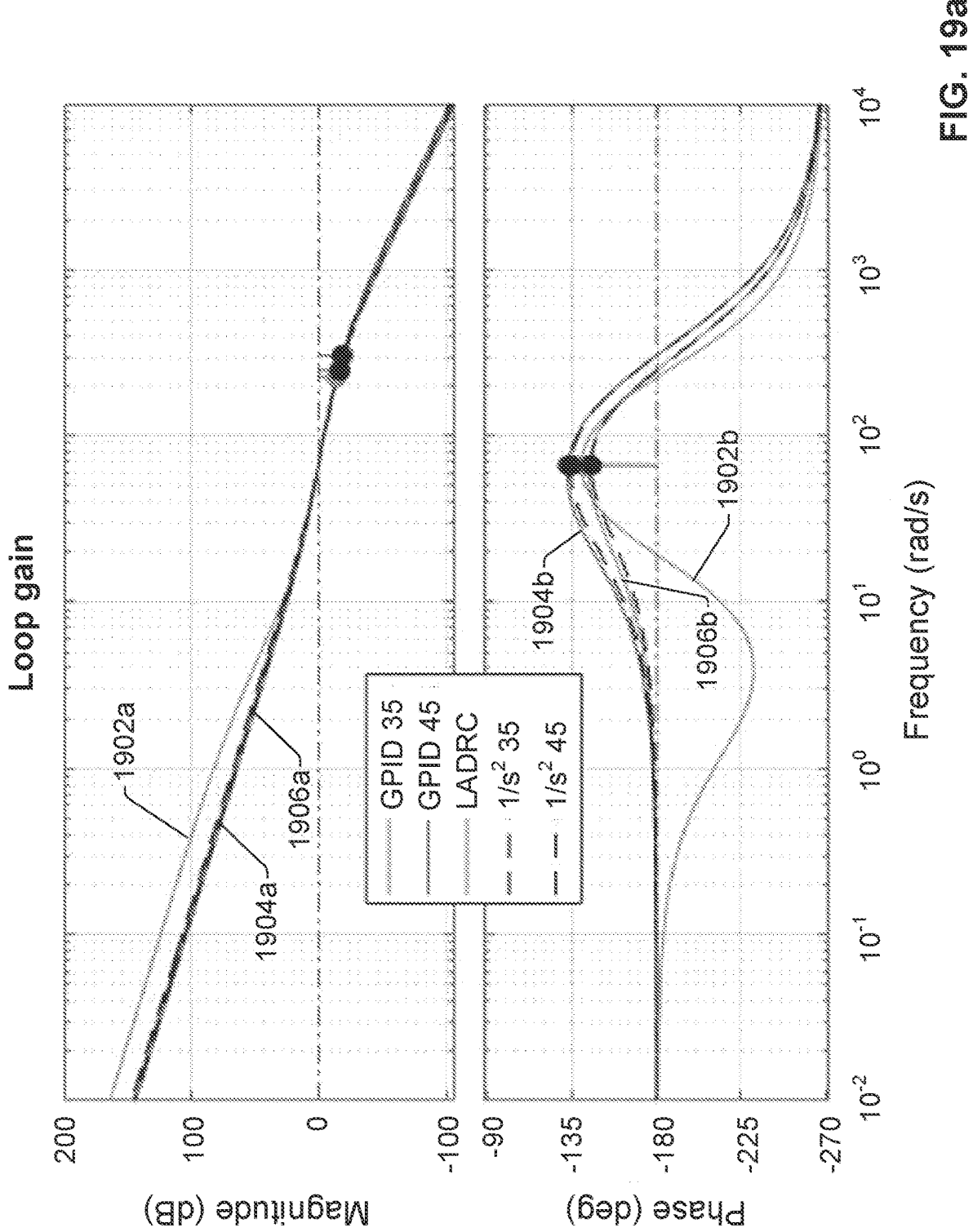
FIG. 19a is a Bode diagram that plots the loop gains of the GPID design and Linear Active Disturbance Rejection Control (LADRC).
Figure 19B:
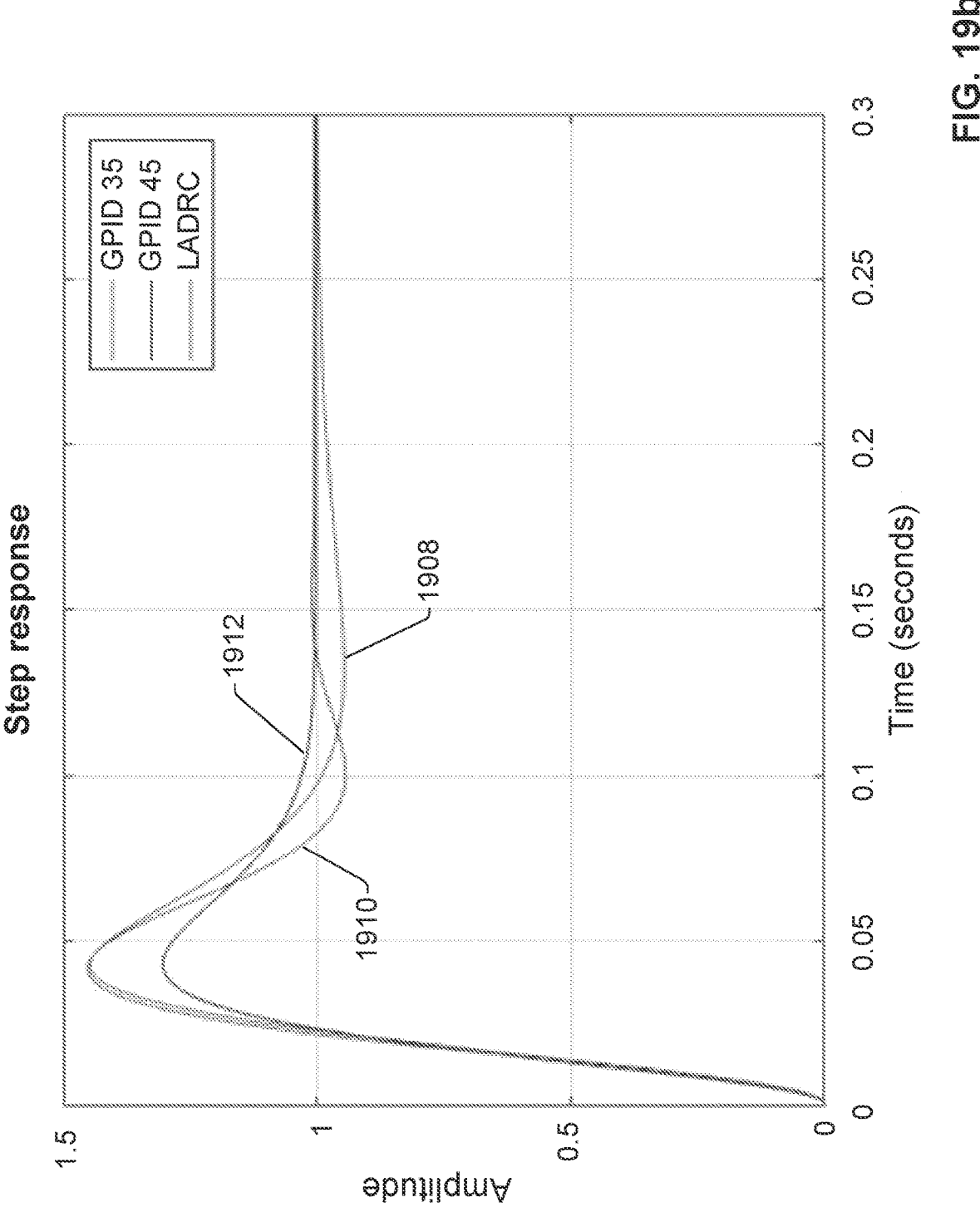
FIG. 19b is a plot of the step responses for the GPID design and LADRC.

FIG. 19a is a Bode diagram that plots the loop gains of the GPID design and Linear Active Disturbance Rejection Control (LADRC) for comparison, where LADRC is represented by lines 1902a and 1902b, GPID with phase margin of 35° is represented by lines 1906a and 1906b, and GPID with phase margin of 45° is represented by lines 1904a and 1904b. FIG. 19b is a plot of the step responses for the GPID design and LADRC for comparison, where LADRC is represented by line 1908, GPID with phase margin of 35° is represented by line 1910, and GPID with phase margin of 45° is represented by line 1912. LADRC has the crossover frequency at 66.4 r/s with phase margin of 39.4°. It can be seen that the GPID solutions with $\omega_c$=66.4 r/s and $\gamma$=1.66, for phase margin of 35° and 45°, respectively, have the same crossover frequency as that of LADRC, as well as similar loop characteristics and step response.

Figure 20A:
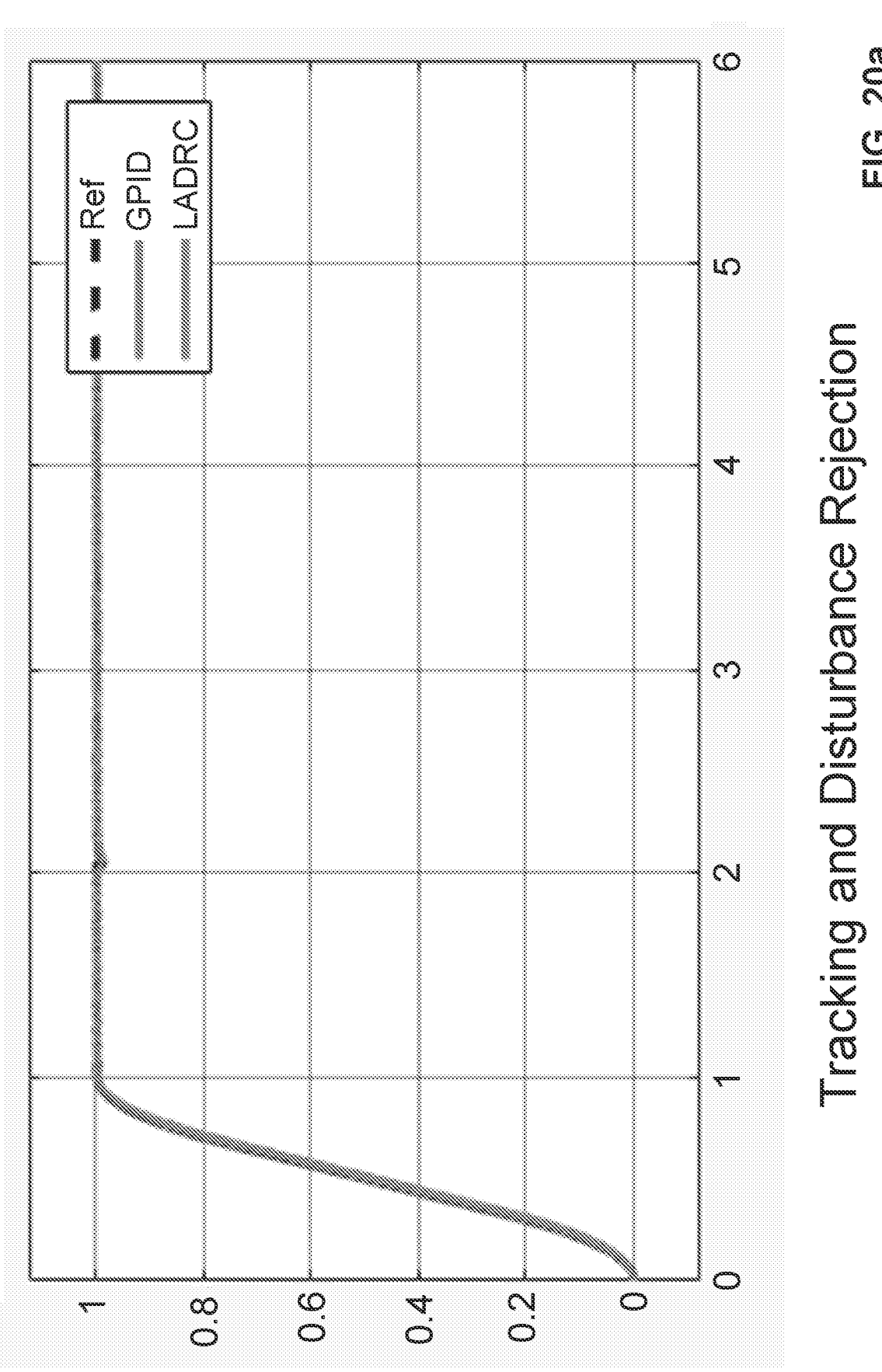
FIG. 20a is a plot of simulation results of tracking and disturbance rejection with K(s) of 35° phase margin.
Figure 20B:
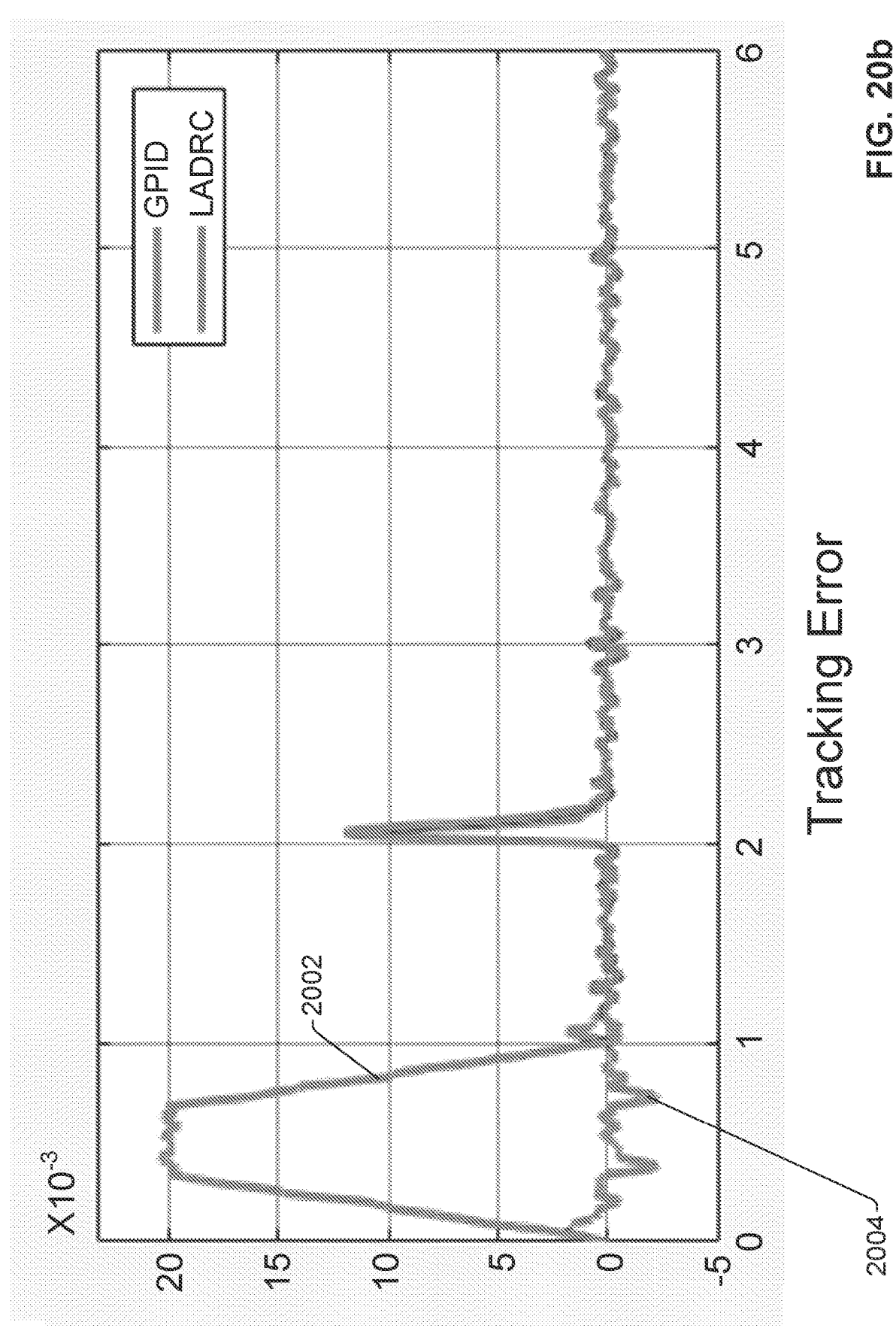
FIG. 20b is a plot of simulation results of tracking error with K(s) of 35° phase margin.
Figure 20C:
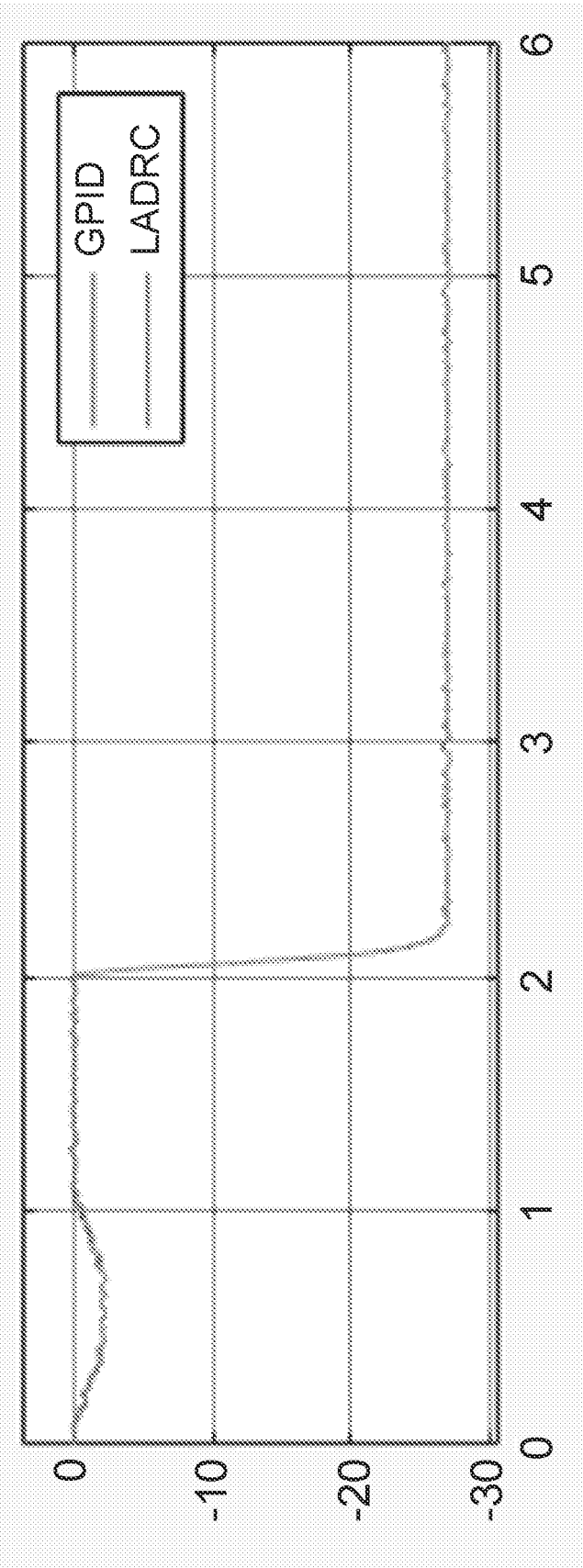
FIG. 20c is a plot of simulation results of total disturbance estimation with K(s) of 35° phase margin.

FIGS. 20a-20d are plots of simulation results of transient, steady state response and control signal with K(s) of 35° phase margin. FIG. 20a plots simulation results of tracking and disturbance rejection, FIG. 20b plots simulation results of tracking error, FIG. 20c plots simulation results of total disturbance estimation, and FIG. 20d plots the control signal. In this simulation, a step input with an amplitude of 116% of the setpoint is introduced at the 2 second mark as the external disturbance. The performances of GPID (phase margin of) 35° and LADRC are close to one another except that GPID has a smaller tracking error in the transient response (see FIG. 20b, in which line 2002 corresponds to LADRC and line 2004 corresponds to GPID). These simulation results validate reference trajectory tracking, disturbance rejection, and noise reduction in control signal.

A case involving motion control with a low frequency resonant mode is now considered. A class of 4th order plant can be given as $$G_p(s) = \frac{k_s}{s^4(m_1 m_2) + s^3(c_1) + s^2(c_2) + s(c_3)} \tag{40}$$

$G_p(s)$ in (40) represents a typical two-mass system (TMS) with resonant mode, where $$c_1 = m_1 v_2 + m_2 v_1 \tag{41}$$

$$c_2 = k(m_1 + m_2) + v_1 v_2 \tag{42}$$

-continued $$c_3 = k(v_1 + v_2) \tag{43}$$

For standardization, assume the spring constant $k_s=1$ newton per meter (N/m), the mass $m_1=m_2=1$ kilogram (kg), and the friction coefficients on masses $m_1$ and $m_2$ are $v_1=v_2=0.01$, which means that n=4 and $G_p(s)$ has a resonant frequency at $\omega r=1.41$ r/s.

In this case, it is assumed that $$T_i = T_j = \frac{\gamma}{\omega_c} < \omega_r^{-1},$$

where $\omega_c$ is the desired approximate system bandwidth and $\gamma=0.1$ in general. For the ideal integral plant of $1/s^4$ and the normalized loop gain crossover frequency of 1 r/s, the controller K(s) with phase margin of 35° is $$K(s) = \frac{(s+0.1)^3}{\left(\frac{s}{6}+1\right)^4} \tag{44}$$

such that K(s) for loop gain crossover frequency of $\omega_c$ is $$K(s) = \frac{\left(\left(\frac{s}{\omega_c}\right)+0.1\right)^3}{\left(\left(\frac{s}{6\omega_c}\right)+1\right)^4} \cdot \omega_c^4 \tag{45}$$

Figure 21:
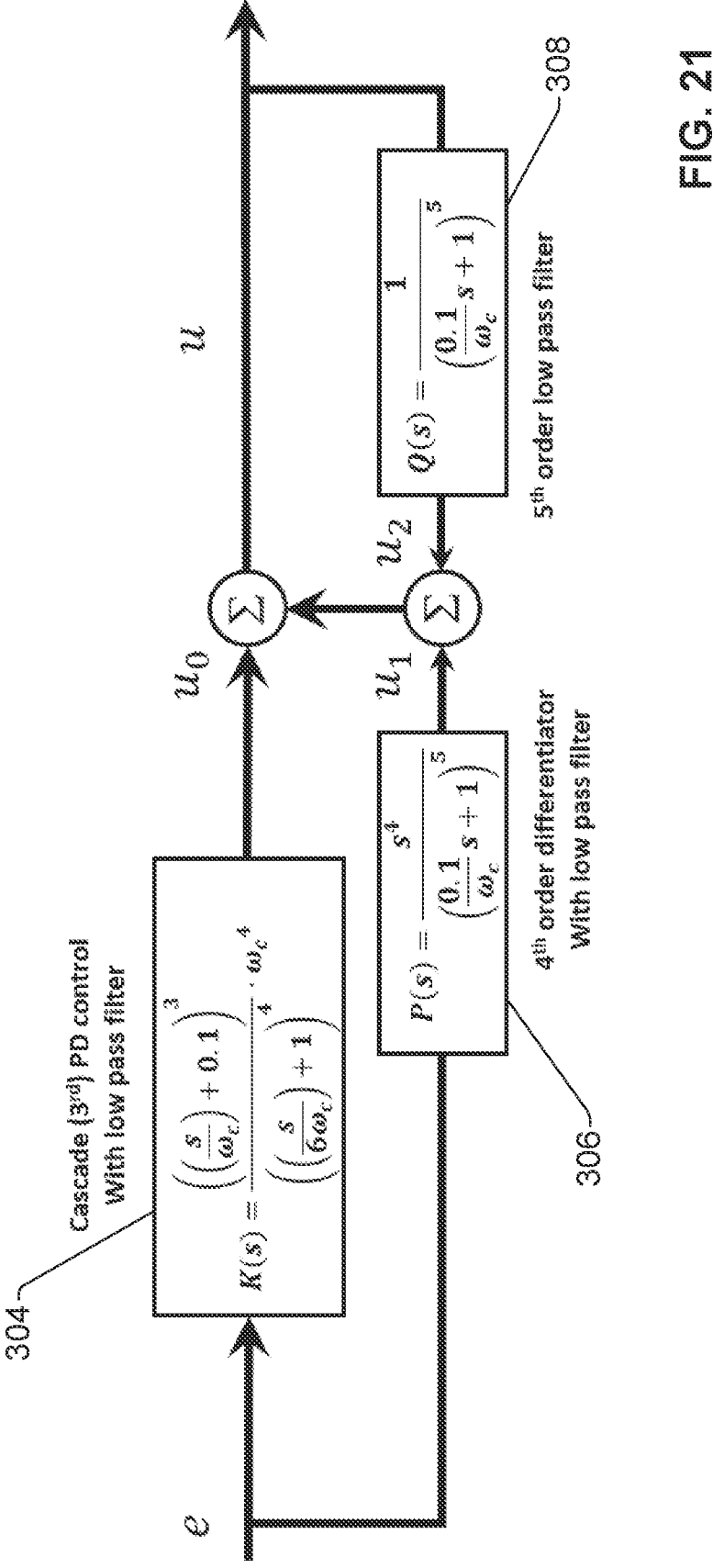
FIG. 21 is a block diagram of an example GPID design for a 4th order motion control plant with low frequency resonant mode.

FIG. 21 is a block diagram of an example GPID design for a 4th order motion control plant with low frequency resonant mode, in which the cascade lead compensator 304 implements the transfer function K(s) given by (45). Differentiator 306 is a 4th order differentiator with low pass filter, and filter 308 is a 5th order low pass filter.

The frequency response analysis and simulation results of this GPID design are now examined. For the purpose of resonant mode cancellation, assume $$T_i = T_j = \frac{1}{30\omega_r} = 0.0236.$$

For $G_p(s)$ this yields $$C(s) = \frac{(1+0.0236s)^5}{s^4 G_p(s) + (1+0.0236s)^5 - 1} \tag{46}$$

and the enforced plant is given by $$G_e(s) = C(s)G_p(s) \tag{47}$$

Figure 22A:
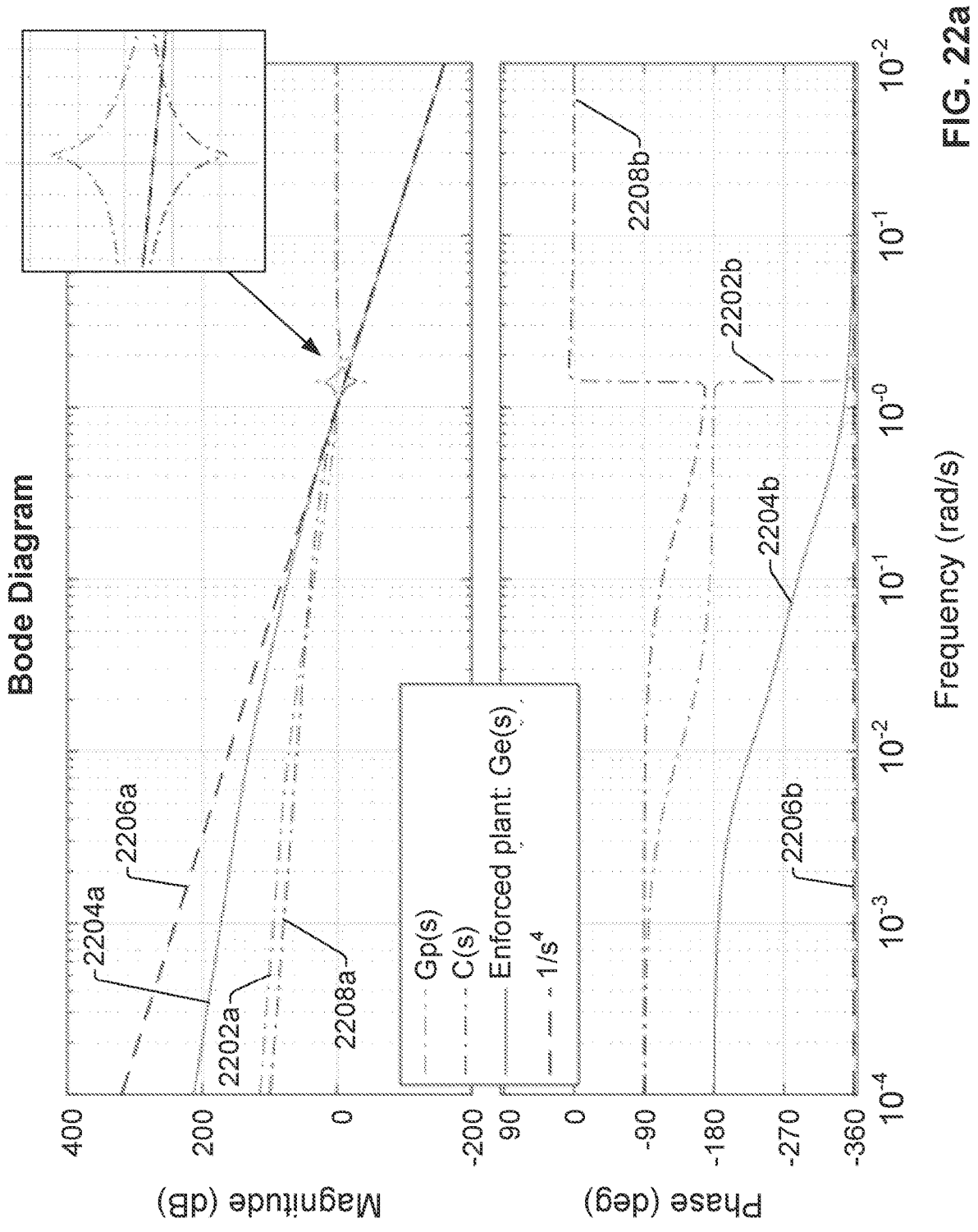
FIG. 22a is a Bode diagram of the frequency response of an original plant of $G_p(s)$, an enforced plant of $G_e(s)=C(s)$ $G_p(s)$, and an ideal plant of $1/s^4$ (lines 2206), together with C(s).

FIG. 22a is a Bode diagram of the frequency response of the original plant of $G_p(s)$ of (40) (lines 2202), the enforced plant of $G_e(s)=C(s)G_p(s)$ (lines 2204), and the ideal plant of $$\frac{1}{s^4}$$

Figure 22B:
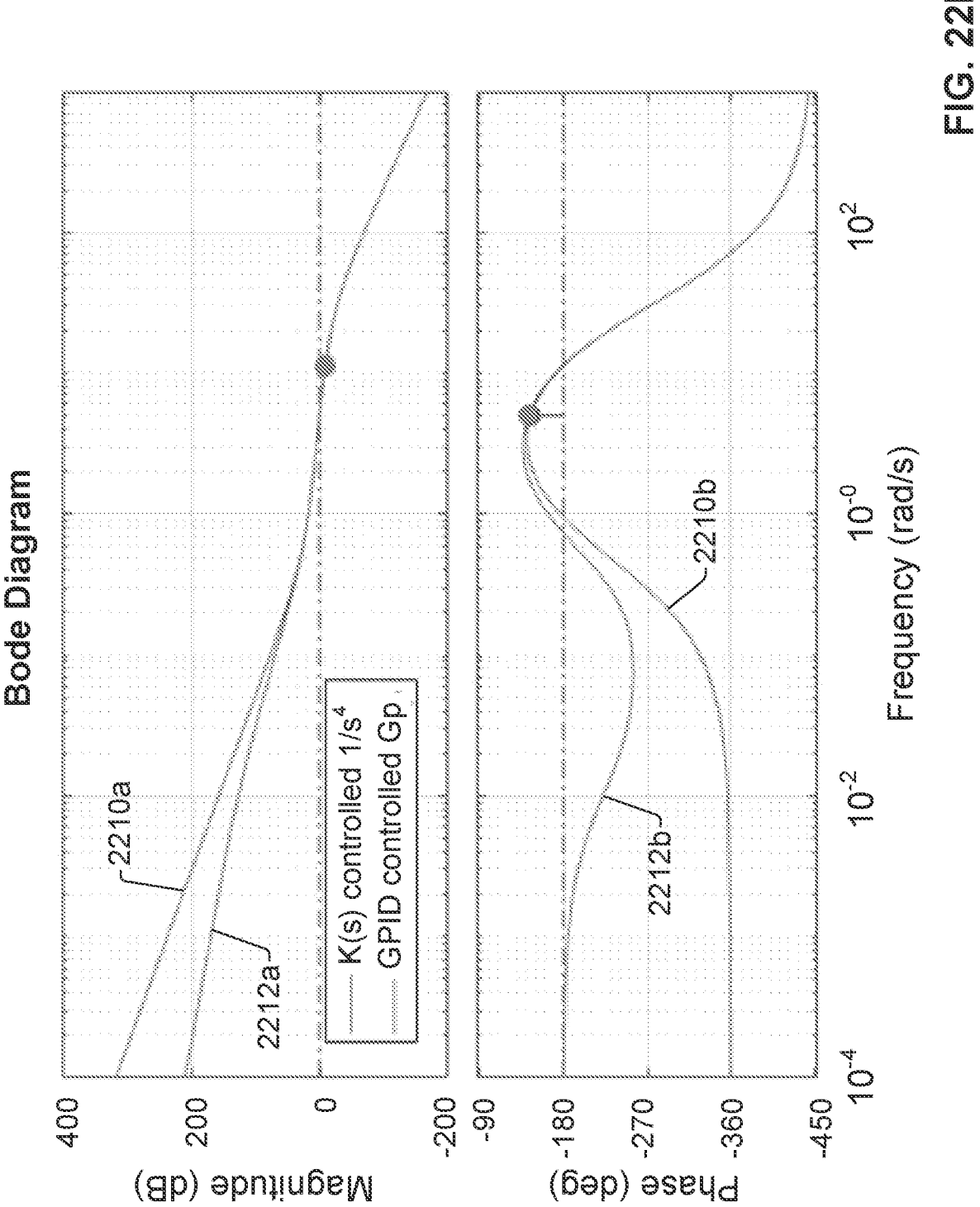
FIG. 22b is a Bode diagram of the loop gain response of the GPID controlled $G_p(s)$ and K(s) controlled $1/s^4$ by frequency scaling to $\omega_c=5$ r/s, $\gamma=0.118$.
Figure 22C:
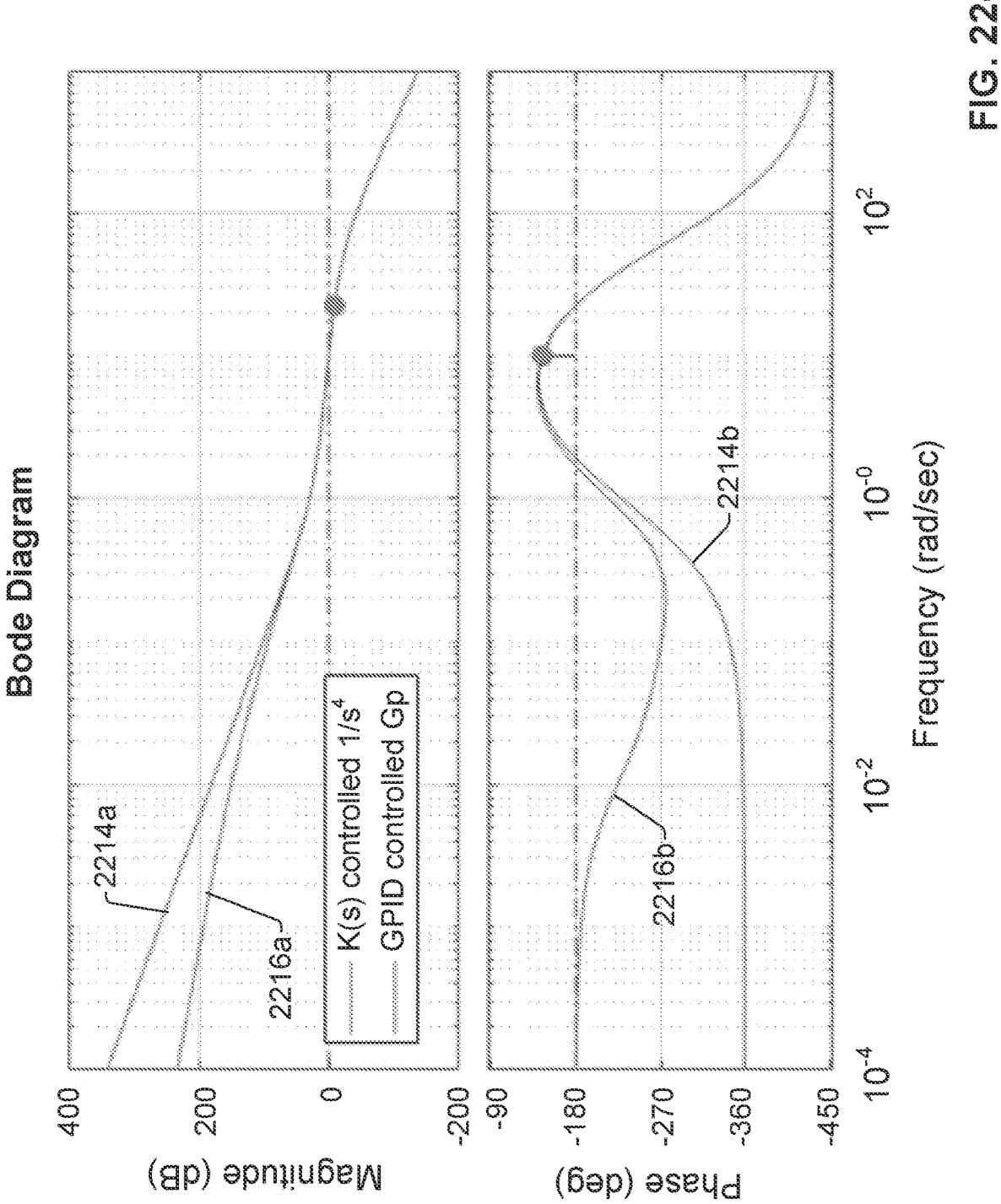
FIG. 22c is a Bode diagram of the loop gain response of the GPID controlled $G_p(s)$ and K(s) controlled $1/s^4$ by frequency scaling to $\omega_c=10$ r/s, $\gamma=0.236$.

(lines 2206), together with C(s) (lines 2208). The cancellation of the resonant mode can be clearly seen. FIGS. 22b and 22c are Bode diagrams of the loop gain responses of the GPID controlled $G_p(s)$ and K(s) controlled $$\frac{1}{s^4}$$

by frequency scaling $\omega_c=5$ r/s, $\gamma=0.118$ and $\omega_c=10$ r/s, $\gamma=0.236$, respectively. In FIG. 22b, lines 2210 represent K(s) controlled $$\frac{1}{s^4}$$

and lines 2212 represent GPID controlled $G_p(s)$. In FIG. 22c, lines 2214 represent K(s) controlled $$\frac{1}{s^4}$$

and lines 2216 represent GPID controlled $G_p(s)$. Note that the GPID controlled loop gain crossover frequency and the phase margin are consistent with that of K(s) controlled $$\frac{1}{s^4},$$

thus validating the GPID design principle with high confidence on a complex motion control problem known to be an industry bottleneck.

Figure 23:
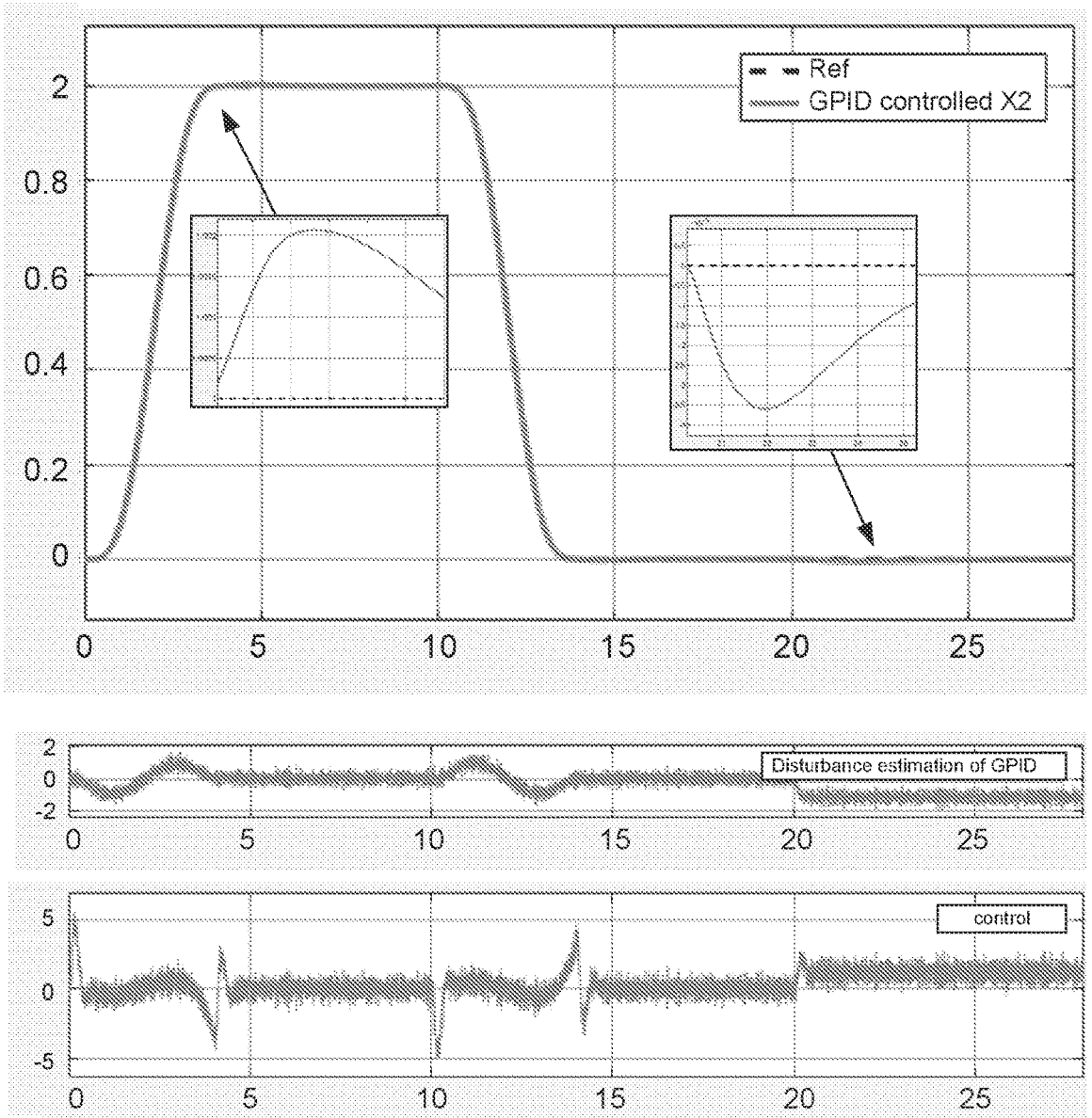
FIG. 23 is a set of graphs plotting simulation results of the transient response, steady state response, and control signal with K(s) of 35° phase margin.

FIG. 23 is a set of graphs plotting simulation results of the transient response, steady state response, and control signal with the K(s) of 35° phase margin. As shown by these simulation results, with the required system bandwidth $\omega_c=10$ r/s, the GPID design is further validated in the time domain in terms of the reference trajectory tracking, disturbance rejection and noise reduction in control signal. A step input with an amplitude of 116% of the setpoint is introduced at the 20 second mark as the external disturbance. $X_2$ is the target system output to be controlled. The overshoot percentage of tracking performance is around 0.2%, and the maximum peak of disturbance rejection is around 0.35%. The bandwidth of the reference trajectory is set to 0.1 times of the system bandwidth. Typically, the higher order derivatives of the motion profile are incorporated as the feedforward control for better tracking performance; however, in this case the approach is reference derivatives-free. That is, only the zero-order trajectory of the motion profile is used.

The GPID control approach described herein provides a comprehensive solution for all industrial control design and tuning problems using language familiar to all control engineers, thereby lowering the threshold of adoption of this advanced control technology. GPID can make controller tuning more intelligible and easier to perform relative to conventional PID tuning since the control system can be tuned using the desired system bandwidth (or the time constant) as the sole tuning parameter, saving energy and improving control performance. The use of lowpass filters in the lead compensator 304, the differentiator 306, and low-pass filter 308 can limit the frequency range of the proportional and derivative terms, reducing or eliminating noise issues in the control signal. The GPID control approach is also applicable to all areas of AI and data analytics where error correction algorithm is a core algorithm.

Figure 24:
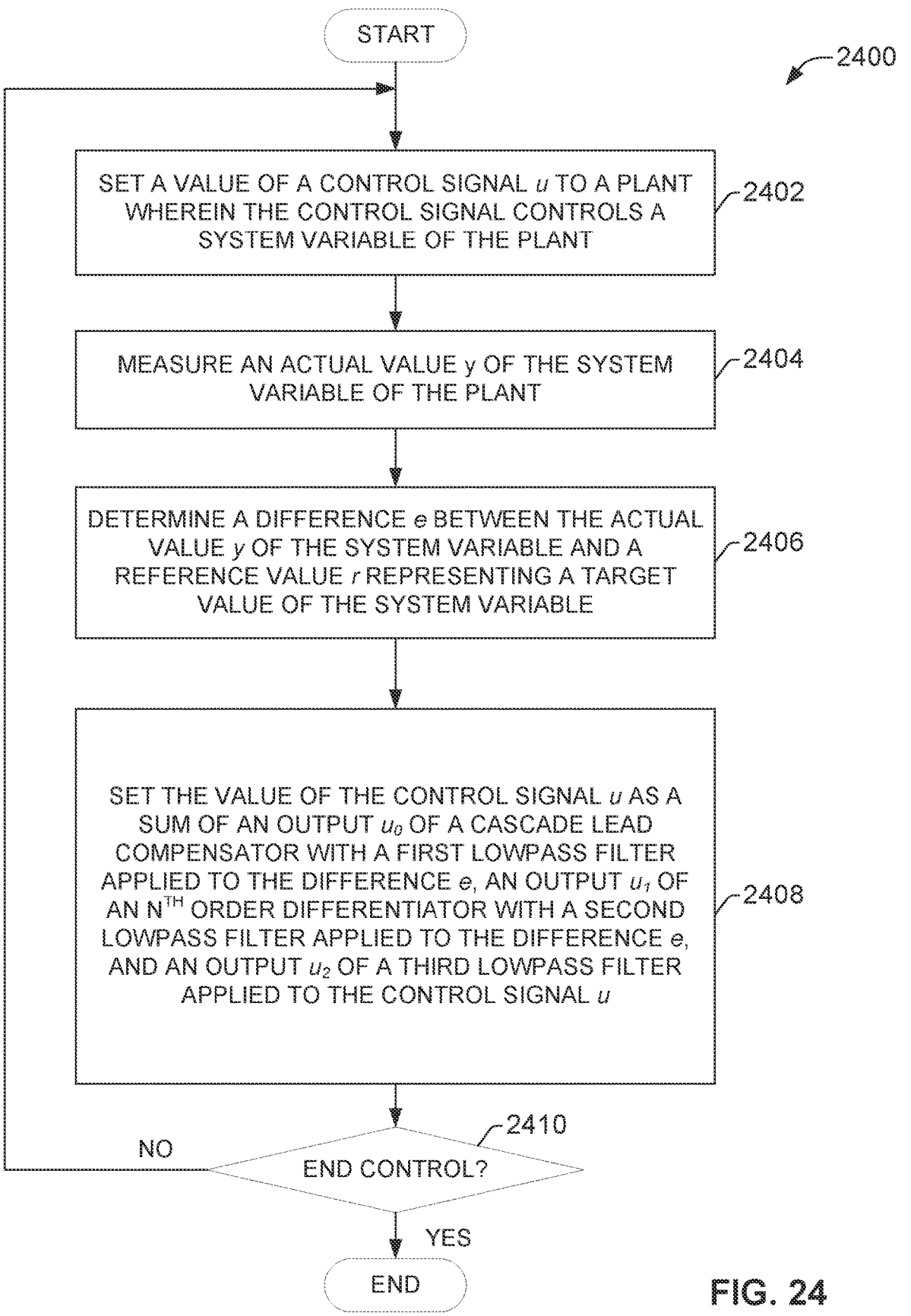
FIG. 24 is a flowchart of an example methodology for controlling a plant modeled using GPID.

FIGS. 24-25 illustrates example methodologies in accordance with certain disclosed aspects. While, for purposes of simplicity of explanation, the methodology is shown and described as a series of acts, it is to be understood and appreciated that the disclosed aspects are not limited by the order of acts, as some acts may occur in different orders and/or concurrently with other acts from that shown and described herein. For example, those skilled in the art will understand and appreciate that a methodology can alternatively be represented as a series of interrelated states or events, such as in a state diagram. Moreover, not all illustrated acts may be required to implement a methodology in accordance with certain disclosed aspects. Additionally, it is to be further appreciated that the methodologies disclosed hereinafter and throughout this disclosure are capable of being stored on an article of manufacture to facilitate transporting and transferring such methodologies to computers.

FIG. 24 illustrates an example methodology 2400 for controlling a plant modeled using GPID. Initially, at 2404, a value of a control signal u to a plant is set (e.g., by a controller that supports GPID control). The control signal u controls a system variable of the plant, such as a speed, a position, a flow, a pressure, a temperature, or another system variable.

At 2404, an actual value y of the system variable is measured. At 2406, a difference e between the actual value y of the system variable and a reference value r representing a target value of the system variable. The target value can be generated, for example, by an industrial control program that monitors and controls the plant.

At 2408, the value of the control signal u is adjusted or regulated according to:

$$u = u_0 + u_1 + u_2$$

where $u_0$ is the output of a cascade lead compensator 304 with lowpass filter having error signal e as its input, $u_1$ is the output of an nth order differentiator 306 with lowpass filter having the error signal e as its input, and $u_2$ is the output of a third lowpass filter 308 having the control signal u as its input.

At 2410, a determination is made as to whether control of the plant is ended. If the control is to continue (NO at step 2410), the methodology returns to step 2402, and steps 2402-2408 are performed continuously until a command is received to end the control. When a command to end the control is received (YES at step 2410), the methodology ends.

FIG. 25 illustrates an example methodology 2500 for tuning an GPID controller for control of a plant. Initially, a value of a desired control system bandwidth $\omega_c$ is received as a tuning parameter for an industrial controller that supports GPID control. At 2504, values of tuning parameters of a cascade lead compensator with a first lowpass filter, an $n^{th}$ order differentiator with a second lowpass filter, and a third lowpass filter are set based on the value of $\omega_c$ received at step 2502. These values can be set automatically based on the bandwidth $\omega_c$, and such that the bandwidths of the first, second, and third lowpass filters are set based on the bandwidth.

At 2506, a value of a control signal u that controls a system variable of a plant is set based on a sum of the outputs of the cascade lead compensator with the first lowpass filter, the $n^{th}$ order differentiator with the second lowpass filter, and the third lowpass filter, where the input of the cascade lead compensator with the first lowpass filter and the $n^{th}$ order differentiator with the second lowpass filter is an error signal e between the actual value y of the system variable and a target value r of the system variable, and the input of the third lowpass filter is the control signal u.

Exemplary Networked and Distributed Environments

One of ordinary skill in the art can appreciate that the various embodiments described herein can be implemented in connection with any computer or other client or server device, which can be deployed as part of a computer network or in a distributed computing environment, and can be connected to any kind of data store where media may be found. In this regard, the various embodiments of the parameter identification system described herein can be implemented in any computer system or environment having any number of memory or storage units (e.g., memory 222 of FIG. 2), and any number of applications and processes occurring across any number of storage units. This includes, but is not limited to, an environment with server computers and client computers deployed in a network environment or a distributed computing environment, having remote or local storage. For example, with reference to FIG. 2, the program execution component 204, GPID control component 206, I/O component 208, and networking component 210 can be stored on a single memory 222 associated with a single device, or can be distributed among multiple memories associated with respective multiple devices. Similarly, components 204, 206, 208, and 210 can be executed by a single processor 220, or by multiple distributed processors associated with multiple devices.

Distributed computing provides sharing of computer resources and services by communicative exchange among computing devices and systems. These resources and services include the exchange of information, cache storage and disk storage for objects. These resources and services can also include the sharing of processing power across multiple processing units for load balancing, expansion of resources, specialization of processing, and the like. Distributed computing takes advantage of network connectivity, allowing clients to leverage their collective power to benefit the entire enterprise. In this regard, a variety of devices may have applications, objects or resources that may participate in the various embodiments of this disclosure.

Figure 26:
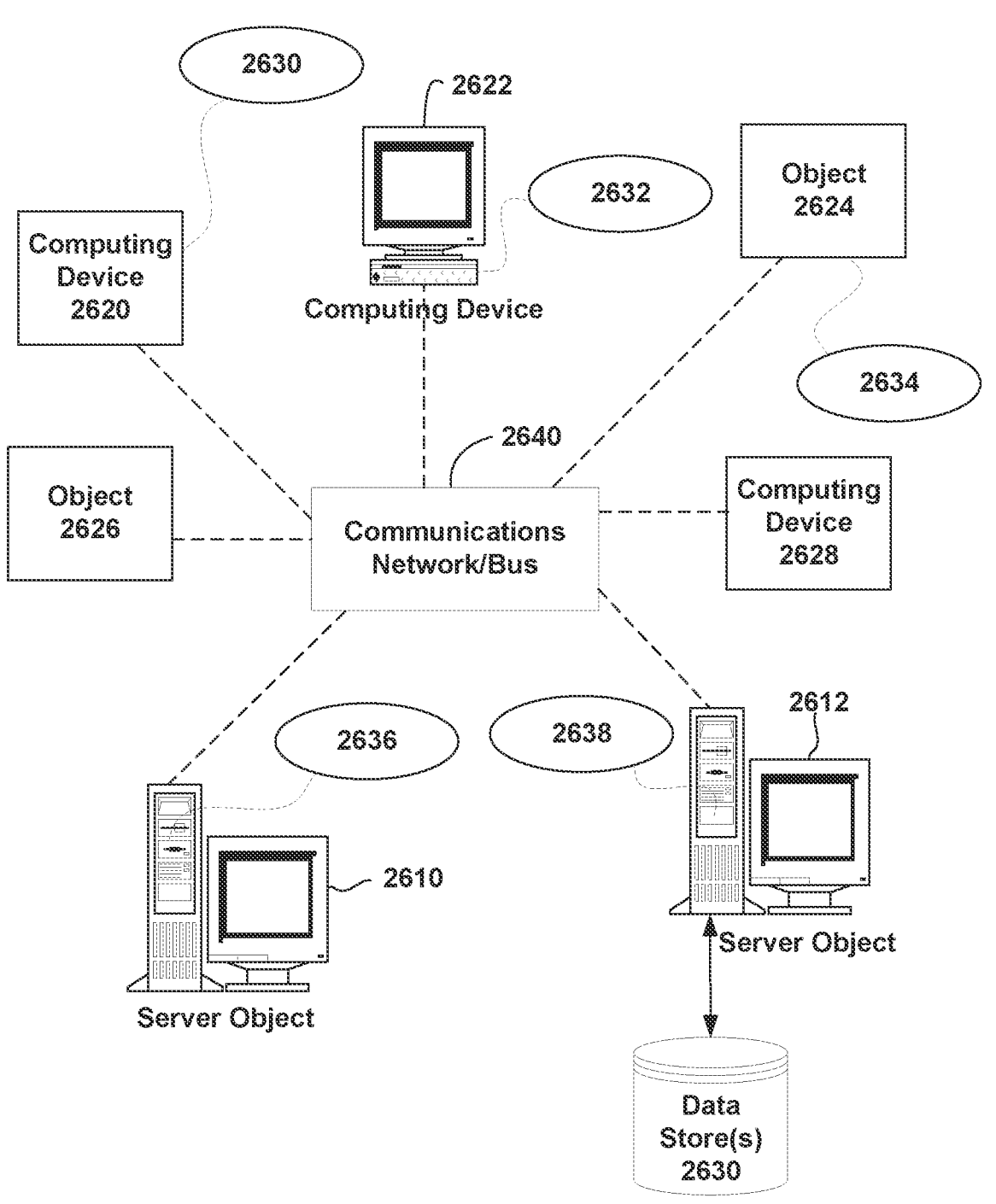
FIG. 26 is a block diagram representing an exemplary networked or distributed computing environment for implementing one or more embodiments described herein.

FIG. 26 provides a schematic diagram of an exemplary networked or distributed computing environment. The distributed computing environment includes computing objects 2610, 2612, etc. and computing objects or devices 2620, 2622, 2624, 2626, 2628, etc., which may include programs, methods, data stores, programmable logic, etc., as represented by applications 2630, 2632, 2634, 2636, 2638. It can be appreciated that computing objects 2610, 2612, etc. and computing objects or devices 2620, 2622, 2624, 2626, 2628, etc. may comprise different devices, such as personal digital assistants (PDAs), audio/video devices, mobile phones, MP3 players, personal computers, laptops, tablets, etc., where embodiments of the inertia estimator described herein may reside on or interact with such devices.

Each computing object 2610, 2612, etc. and computing objects or devices 2620, 2622, 2624, 2626, 2628, etc. can communicate with one or more other computing objects 2610, 2612, etc. and computing objects or devices 2620, 2622, 2624, 2626, 2628, etc. by way of the communications network 2640, either directly or indirectly. Even though illustrated as a single element in FIG. 26, communications network 2640 may comprise other computing objects and computing devices that provide services to the system of FIG. 26, and/or may represent multiple interconnected networks, which are not shown. Each computing object 2610, 2612, etc. or computing objects or devices 2620, 2622, 2624, 2626, 2628, etc. can also contain an application, such as applications 2630, 2632, 2634, 2636, 2638, that might make use of an API, or other object, software, firmware and/or hardware, suitable for communication with or implementation of various embodiments of this disclosure.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any suitable network infrastructure can be used for exemplary communications made incident to the systems as described in various embodiments herein.

Thus, a host of network topologies and network infrastructures, such as client/server, peer-to-peer, or hybrid architectures, can be utilized. The "client" is a member of a class or group that uses the services of another class or group. A client can be a computer process, e.g., roughly a set of instructions or tasks, that requests a service provided by another program or process. A client process may utilize the requested service without having to "know" all working details about the other program or the service itself.

In a client/server architecture, particularly a networked system, a client can be a computer that accesses shared network resources provided by another computer, e.g., a server. In the illustration of FIG. 26, as a non-limiting example, computing objects or devices 2620, 2622, 2624, 2626, 2628, etc. can be thought of as clients and computing objects 2610, 2612, etc. can be thought of as servers where computing objects 2610, 2612, etc. provide data services, such as receiving data from client computing objects or devices 2620, 2622, 2624, 2626, 2628, etc., storing of data, processing of data, transmitting data to client computing objects or devices 2620, 2622, 2624, 2626, 2628, etc., although any computer can be considered a client, a server, or both, depending on the circumstances. Any of these computing devices may be processing data, or requesting transaction services or tasks that may implicate the techniques for systems as described herein for one or more embodiments.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network/bus 2640 is the Internet, for example, the computing objects 2610, 2612, etc. can be Web servers, file servers, media servers, etc. with which the client computing objects or devices 2620, 2622, 2624, 2626, 2628, etc. communicate via any of a number of known protocols, such as the hypertext transfer protocol (HTTP). Computing objects 2610, 2612, etc. may also serve as client computing objects or devices 2620, 2622, 2624, 2626, 2628, etc., as may be characteristic of a distributed computing environment.

Exemplary Computing Device

As mentioned, advantageously, the techniques described herein can be applied to any suitable device. It is to be understood, therefore, that handheld, portable and other computing devices and computing objects of all kinds are contemplated for use in connection with the various embodiments. Accordingly, the below computer described below in FIG. 2271 is but one example of a computing device. Additionally, a suitable server can include one or more aspects of the below computer, such as a media server or other media management server components.

Although not required, embodiments can partly be implemented via an operating system, for use by a developer of services for a device or object, and/or included within application software that operates to perform one or more functional aspects of the various embodiments described herein. Software may be described in the general context of computer executable instructions, such as program modules, being executed by one or more computers, such as client workstations, servers or other devices. Those skilled in the art will appreciate that computer systems have a variety of configurations and protocols that can be used to communicate data, and thus, no particular configuration or protocol is to be considered limiting.

Figure 27:
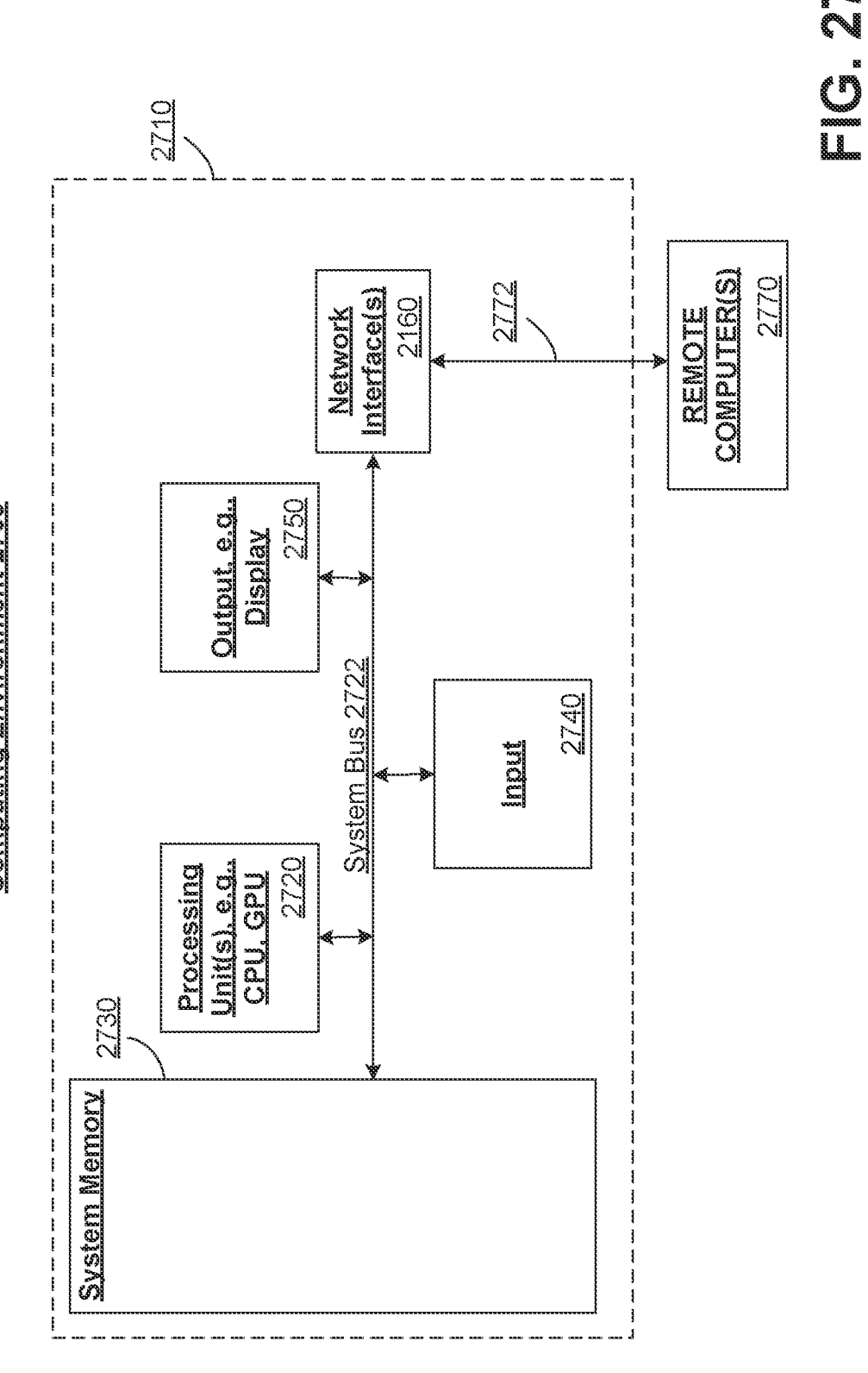
FIG. 27 is a block diagram representing an exemplary computing system or operating environment for implementing one or more embodiments described herein.

FIG. 27 thus illustrates an example of a suitable computing system environment 2700 in which one or aspects of the embodiments described herein can be implemented, although as made clear above, the computing system environment 2700 is only one example of a suitable computing environment and is not intended to suggest any limitation as to scope of use or functionality. Neither is the computing system environment 2700 be interpreted as having any dependency or requirement relating to any one or combination of components illustrated in the exemplary computing system environment 2700.

With reference to FIG. 27, an exemplary computing device for implementing one or more embodiments in the form of a computer 2710 is depicted. Components of computer 2710 may include, but are not limited to, a processing unit 2720, a system memory 2730, and a system bus 2722 that couples various system components including the system memory to the processing unit 2720. Processing unit 2720 may, for example, perform functions associated with processor(s) 220 of controller 202, while system memory 2730 may perform functions associated with memory 222.

Computer 2710 typically includes a variety of computer readable media and can be any available media that can be accessed by computer 2710. The system memory 2730 may include computer storage media in the form of volatile and/or nonvolatile memory such as read only memory (ROM) and/or random access memory (RAM). By way of example, and not limitation, system memory 2730 may also include an operating system, application programs, other program modules, and program data.

A user can enter commands and information into the computer 2710 through input devices 2740, non-limiting examples of which can include a keyboard, keypad, a pointing device, a mouse, stylus, touchpad, touchscreen, trackball, motion detector, camera, microphone, joystick, game pad, scanner, or any other device that allows the user to interact with computer 2710. A monitor or other type of display device is also connected to the system bus 2722 via an interface, such as output interface 2750. In addition to a monitor, computers can also include other peripheral output devices such as speakers and a printer, which may be connected through output interface 2750. In one or more embodiments, input devices 2740 can provide user input to controller 202, while output interface 2750 can receive information relating to operations of the controller 202 from interface component 516.

The computer 2710 may operate in a networked or distributed environment using logical connections to one or more other remote computers, such as remote computer 2170. The remote computer 2170 may be a personal computer, a server, a router, a network PC, a peer device or other common network node, or any other remote media consumption or transmission device, and may include any or all of the elements described above relative to the computer 2710. The logical connections depicted in FIG. 27 include a network 2772, such local area network (LAN) or a wide area network (WAN), but may also include other networks/buses e.g., cellular networks.

As mentioned above, while exemplary embodiments have been described in connection with various computing devices and network architectures, the underlying concepts may be applied to any network system and any computing device or system in which it is desirable to publish or consume media in a flexible way.

Also, there are multiple ways to implement the same or similar functionality, e.g., an appropriate API, tool kit, driver code, operating system, control, standalone or downloadable software object, etc. which enables applications and services to take advantage of the techniques described herein. Thus, embodiments herein are contemplated from the standpoint of an API (or other software object), as well as from a software or hardware object that implements one or more aspects described herein. Thus, various embodiments described herein can have aspects that are wholly in hardware, partly in hardware and partly in software, as well as in software.

The word "exemplary" is used herein to mean serving as an example, instance, or illustration. For the avoidance of doubt, the aspects disclosed herein are not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, for the avoidance of doubt, such terms are intended to be inclusive in a manner similar to the term "comprising" as an open transition word without precluding any additional or other elements.

Computing devices typically include a variety of media, which can include computer-readable storage media (e.g., memory 520) and/or communications media, in which these two terms are used herein differently from one another as follows. Computer-readable storage media can be any available storage media that can be accessed by the computer, is typically of a non-transitory nature, and can include both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

As mentioned, the various techniques described herein may be implemented in connection with hardware or software or, where appropriate, with a combination of both. As used herein, the terms "component," "system" and the like are likewise intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on computer and the computer can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function (e.g., coding and/or decoding); software stored on a computer readable medium; or a combination thereof.

The aforementioned systems have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it is to be noted that one or more components may be combined into a single component providing aggregate functionality or divided into several separate sub-components, and that any one or more middle layers, such as a management layer, may be provided to communicatively couple to such sub-components in order to provide integrated functionality. Any components described herein may also interact with one or more other components not specifically described herein but generally known by those of skill in the art.

In order to provide for or aid in any inferences described herein, components described herein can examine the entirety or a subset of the data to which it is granted access and can provide for reasoning about or infer states of the system, environment, etc. from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data.

Such inference can result in the construction of new events or actions from a set of observed events and/or stored event data, whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines, etc.) can be employed in connection with performing automatic and/or inferred action in connection with the claimed subject matter.

In view of the exemplary systems described above, methodologies that may be implemented in accordance with the described subject matter will be better appreciated with reference to the flowcharts of the various figures (e.g., FIGS. 24-25). While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Where non-sequential, or branched, flow is illustrated via flowchart, it can be appreciated that various other branches, flow paths, and orders of the blocks, may be implemented which achieve the same or a similar result. Moreover, not all illustrated blocks may be required to implement the methodologies described hereinafter.

In addition to the various embodiments described herein, it is to be understood that other similar embodiments can be used or modifications and additions can be made to the described embodiment(s) for performing the same or equivalent function of the corresponding embodiment(s) without deviating there from. Still further, multiple processing chips or multiple devices can share the performance of one or more functions described herein, and similarly, storage can be effected across a plurality of devices. Accordingly, the invention is not to be limited to any single embodiment, but rather can be construed in breadth, spirit and scope in accordance with the appended claims.

What is claimed is:

1. An industrial controller, comprising:
a memory; and
a processor configured to execute components stored on the memory, the components comprising:
    a program execution component configured to execute an industrial control program that sets a reference value r of a system variable of a plant; and
    a generic proportional-integral-derivative (GPID) control component configured to set a value of a control signal u that controls the system variable based on an error signal e representing a difference between the reference value r and a measured value y of the system variable,
    wherein the GPID control component sets the control signal u as a sum of a first output of a cascade lead compensator with a first lowpass filter that processes the error signal e, a second output of an $n^{th}$ order differentiator with a second lowpass filter that processes the error signal e, and a third output of a third lowpass filter applied to the control signal u, where n is an integer.

2. The industrial controller of claim 1, wherein the second output of the $n^{th}$ order differentiator with the second lowpass filter and the third output of the third lowpass filter invert or substantially invert dynamics of the plant.

3. The industrial controller of claim 1, wherein the plant is at least one of a motor-driven industrial automation system; an industrial tool; an industrial robot; a conveyor system; a propulsion system of an electric vehicle; component of a heating, ventilating, and air conditioning (HVAC) system; or a home appliance.

4. The industrial controller of claim 1, wherein the industrial controller comprises at least one of a programmable logic controller, a safety relay, a motor drive, a system-on-chip, or a soft controller.

5. The industrial controller of claim 1, wherein
the GPID component is further configured to set parameter values of the cascade lead compensator with the first lowpass filter, the $n^{th}$ order differentiator with the second lowpass filter, and the third lowpass filter based on a received value of a single tuning parameter, and
the single tuning parameter is an approximate system bandwidth $\omega_c$.

6. The industrial controller of claim 5, wherein the GPID component is further configured to set respective bandwidths of the first lowpass filter, the second lowpass filter, and the third lowpass filter based on the value of the single tuning parameter.

7. The industrial controller of claim 1, wherein the cascade lead compensator with the first lowpass filter is given by $$K(s) = k_p \frac{(1 + T_d s)^m}{\left(1 + sT_d/N\right)^{m+1}}$$

where $k_p$ is a proportional gain parameter, Ta is a generic derivative time constant, and N is a lowpass filter coefficient.

8. The industrial controller of claim 1, wherein the $n^{th}$ order differentiator with the second lowpass filter is given by $$P(s) = \frac{s^n}{(1 + T_j s)^p}$$

where $T_j$ is a $n^{th}$ order differentiator time constant.

9. The industrial controller of claim 1, wherein third lowpass filter is given by $$Q(s) = \frac{1}{(1 + T_i s)^q}$$

where $T_i$ is a generic integral time constant.

10. The industrial controller of claim 1, wherein the GPID control component sets the control signal u according to $$u = K(s)C(s)e,$$

where K(s) is a transfer function of the cascade lead compensator and C(s) represents combined effects of contains an approximate inverse of the transfer function $G_p(s)$ of the plant.

11. A method, comprising:

setting, by a system comprising a processor, a reference value r of a system variable of a plant; and setting, by the system, a value of a control signal u that controls the system variable based on an error signal e representing a difference between the reference value r and a measured value y of the system variable, wherein the setting of the value of the control signal u comprises setting the value of the control signal u as a sum of a first output of a cascade lead compensator with a first lowpass filter that processes the error signal e, a second output of an $n^{th}$ order differentiator with a second lowpass filter that processes the error signal e, and a third output of a third lowpass filter applied to the control signal u, where n is an integer.

12. The method of claim 11, wherein the second output of the $n^{th}$ order differentiator with the second lowpass filter and the third output of the third lowpass filter invert or substantially invert dynamics of the plant.

13. The method of claim 11, wherein the plant is at least one of a motor-driven industrial automation system; an industrial tool; an industrial robot; a conveyor system; a propulsion system of an electric vehicle; component of a heating, ventilating, and air conditioning (HVAC) system; or a home appliance.

14. The method of claim 11, further comprising receiving, by the system, a value of an approximate system bandwidth $\omega_c$; and setting, by the system, parameter values of the cascade lead compensator with the first lowpass filter, the $n^{th}$ order differentiator with the second lowpass filter, and the third lowpass filter based on the value of the approximate system bandwidth $\omega_c$, wherein the value of the approximate system bandwidth $\omega_c$ is a sole tuning parameter of the system.

15. The method of claim 14, further comprising setting, by the system, respective bandwidths of the first lowpass filter, the second lowpass filter, and the third lowpass filter based on the value of the system bandwidth $\omega_c$.

16. The method of claim 11, wherein the cascade lead compensator with the first lowpass filter is given by $$K(s) = k_p \frac{(1 + T_d s)^m}{\left(1 + sT_d/N\right)^{m+1}}$$

where $k_p$ is a proportional gain parameter, $T_d$ is a derivative time constant, and N is a lowpass filter coefficient.

17. The method of claim 11, wherein the $n^{th}$ order differentiator with the second lowpass filter is given by $$P(s) = \frac{s^n}{(1 + T_j s)^p}$$

where $T_j$ is a $n^{th}$ order differentiator time constant.

18. The method of claim 11, wherein third lowpass filter is given by $$Q(s) = \frac{1}{(1 + T_i s)^q}$$

where $T_i$ is an integral time constant.

19. A non-transitory computer-readable medium having stored thereon executable components that, in response to execution by a system comprising a processor, cause the system to perform operations, the operations comprising:

setting a reference value r of a system variable of a plant; and setting a value of a control signal u that controls the system variable based on an error signal e representing a difference between the reference value r and a measured value y of the system variable, wherein the setting of the value of the control signal u comprises:

processing the error signal e with a cascade lead compensator having a first lowpass filter to yield an output $u_0$;

processing the error signal e with an $n^{th}$ order differentiator having a second lowpass filter to yield an output $u_1$;

processing the control signal u with a third lowpass filter to yield an output $u_2$; and setting the value of the control signal u based on a sum of $u_0$, $u_1$, and $u_2$.

20. The non-transitory computer-readable medium of claim 19, wherein the output $u_1$ of the $n^{th}$ order differentiator having the second lowpass filter and the output $u_2$ of the third lowpass filter invert or substantially invert dynamics of the plant.

* * * * *